(12) United States Patent
Kim

(10) Patent No.: US 11,557,633 B2
(45) Date of Patent: Jan. 17, 2023

(54) ORGANIC LIGHT EMITTING DEVICE

(71) Applicant: LG Display Co., Ltd., Seoul (KR)

(72) Inventor: Byungsoo Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 102 days.

(21) Appl. No.: 16/994,262

(22) Filed: Aug. 14, 2020

(65) Prior Publication Data

US 2020/0381490 A1 Dec. 3, 2020

Related U.S. Application Data

(62) Division of application No. 15/198,640, filed on Jun. 30, 2016, now abandoned.

(51) Int. Cl.
*H01L 27/32* (2006.01)
*H01L 51/52* (2006.01)

(52) U.S. Cl.
CPC ...... *H01L 27/3211* (2013.01); *H01L 51/5278* (2013.01); *H01L 2251/5315* (2013.01)

(58) Field of Classification Search
CPC ............. H01L 27/3211; H01L 51/5278; H01L 2251/5315
USPC .......................................................... 257/40
See application file for complete search history.

(56) References Cited

U.S. PATENT DOCUMENTS

| | | | |
|---|---|---|---|
| 2005/0093433 A1 | 5/2005 | Ko | |
| 2005/0100760 A1 | 5/2005 | Yokoyama | |
| 2007/0164278 A1 | 7/2007 | Lee et al. | |
| 2009/0001885 A1* | 1/2009 | Spindler | H01L 51/0079 313/506 |
| 2009/0146552 A1 | 6/2009 | Spindler et al. | |
| 2010/0163854 A1 | 7/2010 | Kho et al. | |
| 2011/0073844 A1 | 3/2011 | Pieh et al. | |
| 2012/0012820 A1* | 1/2012 | Endo | H01L 51/5278 257/40 |
| 2013/0147689 A1* | 6/2013 | Liu | H01L 51/5265 345/76 |
| 2013/0320837 A1 | 12/2013 | Weaver et al. | |
| 2014/0117315 A1* | 5/2014 | Kim | H01L 51/506 257/40 |
| 2014/0151658 A1* | 6/2014 | Lee | H01L 27/3211 257/40 |
| 2015/0155519 A1 | 6/2015 | Lee | |
| 2015/0188073 A1 | 7/2015 | Ahn et al. | |

FOREIGN PATENT DOCUMENTS

| | | |
|---|---|---|
| EP | 2 482 619 A1 | 8/2012 |
| EP | 3 136 465 A1 | 3/2017 |
| KR | 20110035048 A | 4/2011 |

\* cited by examiner

*Primary Examiner* — Dzung Tran

(74) *Attorney, Agent, or Firm* — Morgan, Lewis & Bockius LLP

(57) ABSTRACT

An organic light emitting device having a structure that a plurality of light emitting units are deposited, is disclosed, of which white color shift caused by variation of a viewing angle is reduced through a combination between dopant materials of the respective light emitting units. The organic light emitting device includes dopant materials emitting light of different wavelengths from the plurality of light emitting units. Therefore, in the organic light emitting device, variation of color and luminance, which is perceived by a user as a viewing angle is varied, may be reduced.

9 Claims, 9 Drawing Sheets

@# ORGANIC LIGHT EMITTING DEVICE

CROSS REFERENCE TO RELATED APPLICATIONS

This application is divisional application of U.S. patent application Ser. No. 15/198,640, filed Jun. 30, 2016, which claims the benefit of the Korean Patent Application No. 10-2015-0190121 filed on Dec. 30, 2015, both of which are hereby incorporated by reference for all purposes as if fully set forth herein.

BACKGROUND

Field

The present disclosure relates to an organic light emitting device, and more particularly, to an organic light emitting device having a structure that a plurality of light emitting units are deposited, of which color shift caused by variation of a viewing angle is reduced through a combination of dopant materials of the respective light emitting units.

Discussion of the Related Art

Recently, with the advancement of the information age, a display field for visually displaying an electric information signal has rapidly developed. In response to this trend, various display devices having excellent properties of a thin thickness, a lightweight, and low power consumption have been developed.

Detailed examples of the display devices include liquid crystal display (LCD) devices, plasma display panel (PDP) devices, field emission display (FED) devices, and organic light emitting display (OLED) devices.

Particularly, the organic light emitting display device includes a self-light emitting device, which is an organic light emitting device, and thus is more advantageous than the other display devices in view of a response speed, light emission efficiency, color reproduction ratio, luminance and a viewing angle. The organic light emitting device may apply to a lighting device as well as a display device as a light source, whereby the organic light emitting device has been recently spotlighted even by the field of lighting. Particularly, it is known that the organic light emitting device is better than any other light emitting device to realize a curved or flexible display device or lighting device or a transparent display device or a lighting device.

The organic light emitting device is based on that an organic light emitting layer arranged between two electrodes. Electrons and holes from the two electrodes are injected into the organic light emitting layer to generate an exciton through combination of the electrons and the holes. Light is generated from the organic light emitting device when the exciton is transited from the excited state to a ground state.

The organic light emitting device is configured such that holes are injected from an anode to the organic light emitting layer and electrons are injected from a cathode to the organic light emitting layer. At this time, a zone where exciton is formed by combination of electrons and holes, that is, a recombination zone is formed inside the organic light emitting layer. The organic light emitting device may be one element of respective sub-pixels emitting red (R), green (G) and blue (B). That is, a red sub organic light emitting device, a green sub organic light emitting device and a blue sub organic light emitting device may be included in the red sub-pixel, the green sub-pixel and the blue sub-pixel, respectively, as self-light emitting devices. In this way, pixels that may realize a full-color may be configured by the respective sub-pixels that include the organic light emitting device.

RELATED ART REFERENCE

1. White organic light emitting diode (Korean Patent Application No. 10-2009-0092596, published as KR 2011-0035048-A and having a counterpart of US 2011/0073844-A)

In order that the aforementioned organic light emitting device that enables various applications may be actually applied to more various fields in the future daily life, various color displays and excellent display quality as well as a long lifespan in a poor condition are simultaneously required. To this end, efforts for manufacturing an organic light emitting device of which color display and display quality perceived when a user views the display device or lighting device from a front direction have the same levels as those perceived when a user views the same from a lateral direction have been made continuously.

SUMMARY

Accordingly, the present disclosure is directed to an organic light emitting device that substantially obviates one or more problems due to limitations and disadvantages of the related art.

An object of the present disclosure is to provide an organic light emitting device of which color shift caused by variation of a viewing angle is reduced.

Another object of the present disclosure is to provide an organic light emitting device of which luminance variation caused by variation of a viewing angle is reduced.

Yet another object of the present disclosure is to provide an organic light emitting device of which color shift of white light obtained by mixture of red light, green light and blue light is reduced, as color shift and luminance variation of each of the red light, the green light and the blue light, which are caused by variation of a viewing angle, are reduced.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

The present disclosure relates to an organic light emitting device of which color shift caused by variation of a viewing angle is reduced through a combination between dopant materials of a plurality of light emitting units deposited therein. The organic light emitting device may include dopant materials emitting light of different wavelengths from the plurality of light emitting units. Therefore, in the organic light emitting device, variation of color and luminance, which is perceived by a user as a viewing angle is varied, may be reduced. In more detail, the organic light emitting device may minimize standard chromaticity diagram variation and luminance variation, which are caused by variation of a viewing angle, with respect to each of red light emitted from a red sub organic light emitting device, green light emitted from a green sub organic light emitting device and blue light emitted from a blue sub organic light emitting device. Therefore, color shift caused by variation of a viewing angle of white light obtained by mixture of red light, green light and blue light is minimized.

According to one embodiment, an organic light emitting device comprises an anode and a cathode, which are spaced apart from each other to face each other, and a first light emitting unit including a first organic light emitting layer, a charge generating layer, and a second light unit including a second organic light emitting layer, which are between the anode and the cathode. In this case, a main dopant material is doped on any one of the first organic light emitting layer and the second organic light emitting layer, and an auxiliary dopant material emitting the same colored light as that of the main dopant material is doped on the other one among the first organic light emitting layer or the second organic light emitting layer having the main dopant material doped thereon, and a photoluminescence (PL) peak of the main dopant material is arranged in a relatively long wavelength zone within the range of 0 nm to 15 nm as compared with a PL peak of the auxiliary dopant material.

In another aspect, an organic light emitting device comprises a red sub organic light emitting device, which includes a first red light emitting unit, a charge generating layer and a second red light emitting unit, a green sub organic light emitting device, which includes a first green light emitting unit, a charge generating layer and a second green light emitting unit, and a blue sub organic light emitting device, which includes a first blue light emitting unit, a charge generating layer and a second blue light emitting unit. In this case, the first red light emitting unit includes a first red organic light emitting layer doped with a red main dopant material, the second red light emitting unit includes a second red organic light emitting layer doped with a red auxiliary dopant material, the first green light emitting unit includes a first green organic light emitting layer doped with a green main dopant material, the second green light emitting unit includes a second green organic light emitting layer doped with a green auxiliary dopant material, the first blue light emitting unit includes a first blue organic light emitting layer doped with a blue main dopant material, the second blue light emitting unit includes a second blue organic light emitting layer doped with a blue auxiliary dopant material, and at least one among $X_R$, $X_G$, and $X_B$ is greater than 0 (zero) when an absolute value of a difference between a PL peak wavelength of the red main dopant material and a photoluminescence (PL) peak wavelength of the red auxiliary dopant material is $X_R$, an absolute value of a difference between a PL peak wavelength of the green main dopant material and a PL peak wavelength of the green auxiliary dopant material is $X_G$, and an absolute value of a difference between a PL peak wavelength of the blue main dopant material and a PL peak wavelength of the blue auxiliary dopant material is $X_B$.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1A:
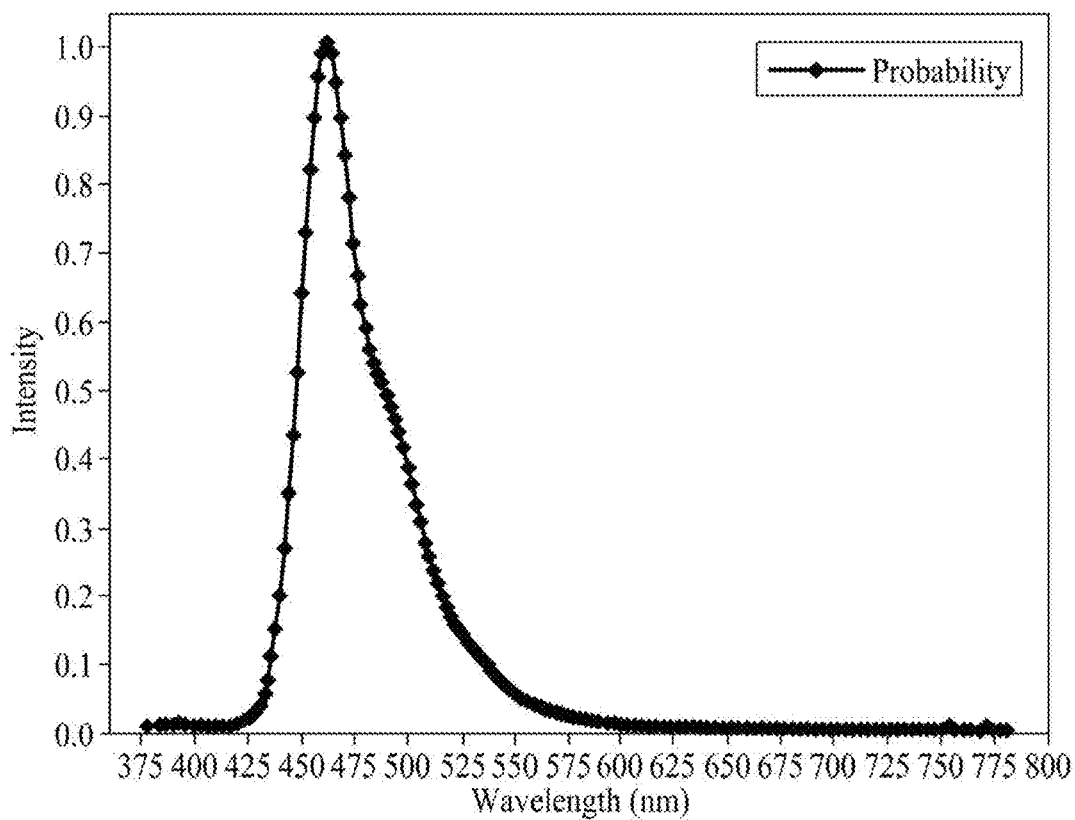
FIG. 1A is a view illustrating a PL (photoluminescence) spectrum according to one example embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It should be understood that the term "at least one" includes all combinations related with one or more items. For example, "at least one among a first item, a second item and a third item" may include all combinations of two or more items selected from the first, second and third items as well as each item of the first, second and third items.

It will be understood that, although the terms "first", "second", etc. may be used herein to describe various elements, these elements should not be limited by these terms. These terms are only used to distinguish one element from another element. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In this specification, a lowest unoccupied molecular orbitals (LUMO) energy level and a highest occupied molecular orbitals (HOMO) energy level of a random layer mean a LUMO energy level and a HOMO energy level of a material that occupies most of a weight ratio of the corresponding layer, for example, a host material unless the HOMO energy level and the LUMO energy level refer to those of a dopant material doped on the corresponding layer.

In this specification, 'the HOMO energy level' may be an energy level measured by cyclic voltammetry (CV) that determines an energy level from a relative potential value for a reference electrode that knows an electrode potential value. For example, Ferrocene that knows an oxidation potential value and a reduction potential value may be used as a reference electrode to measure a HOMO energy level of a random material.

In this specification, 'doped' means that a material having property different from that of a material that occupies most of a weight ratio of a random layer is added to the material that occupies most of a weight ratio of a random layer, in the range of a weight ratio less than 10% (different properties mean, for example, N-type and P-type, and organic material and inorganic material). In other words, a 'doped' layer means a layer that may identify a host material of a random layer from a dopant material of the corresponding layer by considering a portion of a weight ratio. Also, 'undoped' means all cases other than the 'doped' case. For example, if a random layer is comprised of a single material or comprised of mixture materials of which properties are the same as or similar to each other, the corresponding layer is included in the 'undoped' layer. For example, if at least one of materials constituting a random layer is P-type and all of materials constituting the corresponding layer are not N-type, the corresponding layer is included in the 'undoped' layer. For example, if materials constituting a random layer are organic materials and all of materials constituting the corresponding layer are not inorganic materials, the corresponding layer is included in the 'undoped' layer. For example, if materials constituting a random layer are all organic materials and at least one of the materials constituting the corresponding layer is N-type and at least another one is P-type, and if the N-type material is less than 10% of a weight ratio or the P-type material is less than 10% of a weight ratio, the corresponding layer is included in the 'doped' layer.

In this specification, EL (electroluminescence) spectrum (see FIG. 1C) is obtained by the product of (1) a PL (photoluminescence) spectrum (see FIG. TA which illustrates a probability curve) that reflects unique property of a luminescence material such as a dopant material or a host material, which is included in an organic light emitting layer and (2) an out-coupling emittance spectrum curve (see FIG. 1B) determined in accordance with a structure and optical property of an organic light emitting device including a thickness of organic layers such as an electron transporting layer. The horizontal axis represents a wavelength (nm), and the vertical axis represents a light intensity (a.u). If the out-coupling emittance spectrum curve is varied depending on a viewing angle of a user with respect to a direction of light emitted from the organic light emitting device, the EL spectrum is also varied depending on the viewing angle. Unless specifically mentioned with respect to viewing angle conditions, the EL spectrum in this specification means EL spectrum corresponding to a case where a viewing angle of a user with respect to a direction of light emitted from the organic light emitting device is 0° (that is, front surface of the organic light emitting device).

In this specification, a light emitting unit means a unit structure that includes an organic layer and an organic light emitting layer, wherein the organic layer includes an electron transporting layer and a hole transporting layer, and the organic light emitting layer is arranged between the electron transporting layer and the hole transporting layer. The organic layer may further include an electron injecting layer, a hole injecting layer and a hole blocking layer. In addition, the light emitting unit may further include another organic layers in accordance with a structure and design of the organic light emitting device.

Hereinafter, various embodiments of the present disclosure will be described in detail with reference to the accompanying drawings.

Figure 2:
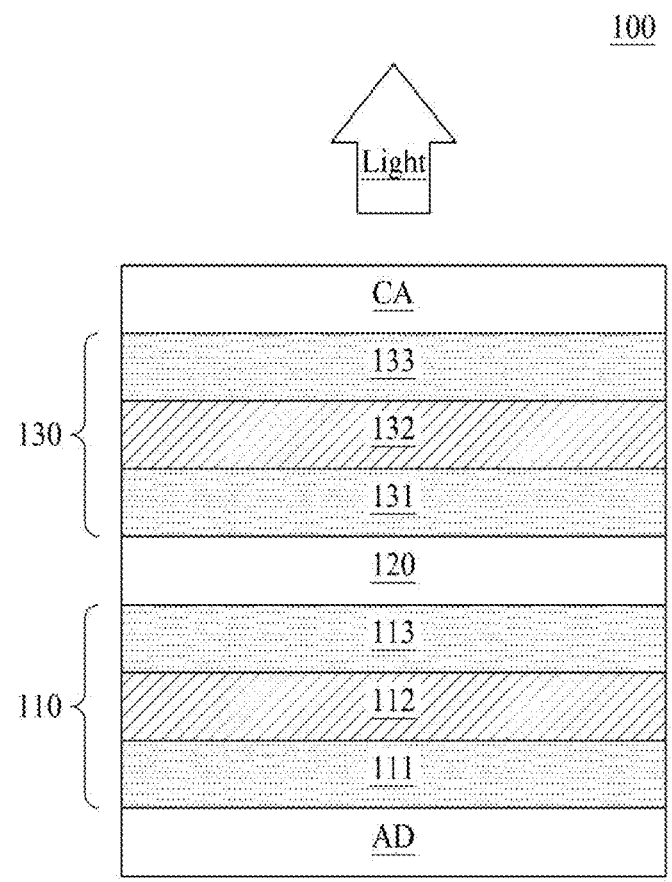
FIG. 2 is a cross-sectional view illustrating an organic light emitting diode according to an example embodiment of the present disclosure.

FIG. 2 is a cross-sectional view illustrating an organic light emitting device 100 according to an example embodiment of the present disclosure. Referring to FIG. 2, the organic light emitting device 100 according to the first embodiment of the present disclosure includes an anode AD, a cathode CA, a first light emitting unit 110, a charge generating layer 120 and a second light emitting unit 130, wherein the anode AD and the cathode CA are spaced apart from each other to face each other, and the first light emitting unit 110, the charge generating layer 120 and the second light emitting unit 130 are deposited between the anode AD and the cathode CA. The first light emitting unit 110 includes a first hole transporting layer 111, a first organic light emitting layer 112 and a first electron transporting layer 113, and the second light emitting unit 130 includes a second hole transporting layer 131, a second organic light emitting layer 132 and a second electron transporting layer 133.

An electric field is formed in the organic light emitting device 100 according to an example embodiment of the present disclosure by the anode AD and the cathode CA. The anode AD is an electrode that supplies holes to the organic light emitting device 100 according to an example embodiment of the present disclosure. The anode AD may be connected to a source or drain of a driving thin film transistor that drives the organic light emitting device 100.

The anode AD may be made of a transparent conductive material having a high work function. For example, the anode AD may be formed of, but not limited to, a transparent conductive material such as Tin Oxide (TO), Indium Tin Oxide (ITO), Indium Zinc Oxide (IZO), and Indium Tin Zinc Oxide (ITZO). If the organic light emitting device 100 according to an example embodiment of the present disclosure is applied to a top-emission type organic light emitting display device, the organic light emitting device may include a reflective layer made of a material having an excellent reflectivity, such as Ag or Ag alloy, below the anode AD. That is, the anode AD may reflect light generated from the first organic light emitting layer 112.

The cathode CA is an electrode that supplies electrons to the organic light emitting device 100 according to an example embodiment of the present disclosure. The cathode CA may be made of a material having a low work function. The cathode CA may include a transparent conductive material. For example, the cathode CA may be formed of Indium Tin Oxide (ITO), Indium Zinc Oxide (IZO), and Indium Gallium Zinc Oxide (IGZO). Alternatively, the cathode CA may include at least one of a group formed of a metal material such as Au, Ag, Al, Mo, Mg, Pd, and Cu or their alloy. For example, the cathode CA may be formed of an alloy (Mg:Ag) of Mg and Ag. Alternatively, the cathode CA may be comprised in such a manner that a layer formed of a transparent conductive material such as Indium Tin Oxide (ITO), Indium Zinc Oxide (IZO), and Indium Gallium Zinc Oxide (IGZO) and a layer formed of a metal material such as Au, Ag, Al, Mo, Mg, Pd, and Cu or their alloy are deposited. However, the cathode CA is not limited to the above structure. If the organic light emitting device 100 according to an example embodiment of the present disclosure is applied to a top-emission type organic light emitting display device, the cathode CA may have transparency or semi-transmittance to allow light generated inside the organic light emitting device to be externally emitted through the cathode CA.

The first hole transporting layer 111 is supplied with holes from the anode AD, and transfers the holes to the first organic light emitting layer 112. The first hole transporting layer 111 is formed of a first hole transporting material. A material electrochemically stabilized by being cationized (that is, by losing electrons) may be the first hole transporting material. A material generating stabilized radical cation may be the first hole transporting material. A material which is easy to be cationized by including aromatic amine may be the first hole transporting material. For example, the first hole transporting layer 111 may be formed of, but not limited to, any one among NPD(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine), spiro-TAD(2,2',7,7'-tetrakis(N,N-dimethylamino)-9,9-spirofluorene) and MTDATA(4,4',4"-Tris(N-3-methylphenyl-N-phenyl-amino)-triphenylamine).

The first organic light emitting layer 112 is arranged between the first hole transporting layer 111 and the first electron transporting layer 113. The organic light emitting device is comprised such that exciton is formed by combination of holes and electrons within the first organic light emitting layer 112. The first organic light emitting layer 112 includes a material that may emit light of a certain color. The first organic light emitting layer 112 takes a host-dopant system. That is, the first organic light emitting layer 112 may be doped on a first host material, which occupies a great weight ratio, to allow a first dopant material, which contributes to luminescence, to occupy a small weight ratio (for example, 2% to 20%). The first organic light emitting layer 112 may be, but not limited to, a layer emitting red light, a layer emitting green light, a layer emitting blue light, or a layer emitting yellow-green light. At this time, if a peak wavelength of a PL spectrum based on photoluminescence emitted from the first organic light emitting layer is between 620 nm and 780 nm, it may be regarded that the first organic light emitting layer emits red light. If a peak wavelength of a PL spectrum based on photoluminescence emitted from the first organic light emitting layer is between 491 nm and 560 nm, it may be regarded that the first organic light emitting layer emits green light. If a peak wavelength of a PL spectrum based on photoluminescence emitted from the first organic light emitting layer is between 450 nm and 491 nm, it may be regarded that the first organic light emitting layer emits blue light.

If the first organic light emitting layer emits red light, the first host material may include, but not limited to, any one or more of anthracene derives such as MADN(2-methyl-9,10-di(2-naphthyl) anthracene). Also, a material used for the first electron transporting layer, which will be described later, may be used as the first host material. At this time, the first host material may include, but not limited to, any one or more of NPD(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine), spiro-TAD(2,2',7,7'-tetrakis(N,N-dimethylamino)-9,9-spirofluorene), MTDATA(4,4',4"-Tris(N-3-methylphenyl-N-phenyl-amino)-triphenylamine), Alq$_3$(tris(8-hydroxyquinolino)aluminum), Liq(8-hydroxyquinolinolato-lithium), PBD(2-(4-biphenylyl)-5-(4-tert-butylphenyl)-1,3,4oxadiazole), TAZ(3-(4-biphenyl)4-phenyl-5-tert-butylphenyl-1,2,4-triazole), spiro-PBD, and BAlq(bis(2-methyl-8-quinolinolate)-4-(phenylphenolato)aluminium), SAlq, TPBi(2,2',2"-(1,3,5-benzinetriyl)-tris(1-phenyl-1-H-benzimidazole)), oxadiazole derives, triazole derives, phenanthroline derives, benzoxazole derives, or benzthiazole derives.

If the first organic light emitting layer emits red light, the first dopant material may include, but not limited to, any one or more of Ir ligand complex such as Ir(ppy)$_3$ (tris(2-phenylpyridine)iridium), PIQIr(acac)(bis(1-phenylisoquinoline) acetylacetonate iridium), PQIr(acac)(bis(1-phenylquinoline) acetylacetonate iridium), PQIr(tris(1-phenylquinoline) iridium), Ir(piq)$_3$(tris(1-phenylisoquinoline)iridium), and Ir(piq)$_2$(acac)(bis(1-phenylisoquinoline)(acetylacetonate)iridium), pyran derives such as PtOEP(octaethylporphyrinporphine platinum), PBD:Eu(DBM)3(Phen), and DCJTB(4-(dicyanomethylene)-2-tert-butyl-6-(1,1,7,7-tetramethyljulolidyl-9-enyl)-4H), boron derives and perylene derives.

If the first organic light emitting layer emits green light, the first host material may include, but not limited to, any one or more of anthracene derives such as TBSA(9,10-bis [(2",7"-di-t-butyl)-9',9"-spirobifluorenyl]anthracene) and ADN(9,10-di(naphth-2-yl)anthracene). Also, a material used for the first electron transporting layer may be used as the first host material. At this time, the first host material may include, but not limited to, any one or more of NPD (N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine), spiro-TAD(2,2',7,7'-tetrakis(N,N-dimethylamino)-9,9-spirofluorene), MTDATA(4,4',4"-Tris(N-3-methylphenyl-N-phenyl-amino)-triphenylamine), Alq$_3$ (tris(8-hydroxyquinolino)aluminum), Liq(8-hydroxyquinolinolato-lithium), PBD(2-(4-biphenylyl)-5-(4-tert-butylphenyl)-1,3,4-oxadiazole), TAZ(3-(4-biphenyl)4-phenyl-5-tert-butylphenyl-1,2,4-triazole), spiro-PBD, and BAlq(bis(2-methyl-8-quinolinolate)-4-(phenylphenolato) aluminium), SAlq, TPBi(2,2',2"-(1,3,5-benzinetriyl)-tris(1-phenyl-1-H-benzimidazole), oxadiazole derives, triazole derives, phenanthroline derives, benzoxazole derives and benzthiazole derives.

If the first organic light emitting layer emits green light, the first dopant material may include, but not limited to, any one or more of Ir ligand complex including Ir(ppy)$_3$(tris(2-phenylpyridine)iridium), and Alq$_3$(tris(8-hydroxyquinolino) aluminum).

If the first organic light emitting layer emits blue light, for example, the first host material may include, but not limited to, any one or more of anthracene derives such as TBSA (9,10-bis[(2'',7''-di-t-butyl)-9',9''-spirobifluorenyl]anthracene), Alq$_3$(tris(8-hydroxy-quinolino)aluminum), and ADN (9,10-di(naphth-2-yl)anthracene), BSBF(2-(9,9-spirofluoren-2-yl)-9,9-spirofluorene), CBP (4,4'-bis(carbazol-9-yl) biphenyl), spiro-CBP(2,2',7,7'-tetrakis(carbazol-9-yl)-9,9'-spirobifluorene), mCP and TcTa (4,4',4''-tris(carbazoyl-9-yl) triphenylamine).

If the first organic light emitting layer emits blue light, for example, the first dopant material may include, but not limited to, any one or more of pyrene transposed from aryl amine based compound, Ir ligand complex including FIrPic (bis(3,5-difluoro-2-(2-pyridyl)phenyl-(2-carboxyprdidyl) iridium) and Ir(ppy)$_3$ (tris(2-phenylpyridine)iridium), spiro-DPVBi, spiro-6P, spiro-BDAVBi(2,7-bis[4-(diphenylamino)styryl]-9,9'-spirofluorene), distyryl benzene (DSB), distyryl arylene (DSA), polyfluorene (PFO) based polymer and poly(p-phenylene vinylene) (PPV) based polymer.

The first electron transporting layer 113 is supplied with electrons from the cathode CA, and transfers the electrons to the first organic light emitting layer 112. The first electron transporting layer 113 is formed of a first electron transporting material. A material electrochemically stabilized by being cationized (that is, by obtaining electrons) may be the first electron transporting material. A material generating stabilized radical cation may be the first electron transporting material. A material which is easy to be cationized by hetero atoms by including heterocyclic ring may be the first electron transporting material. For example, the first electron transporting material may include, but not limited to, any one of Alq$_3$(tris(8-hydroxyquinolino)aluminium), Liq(8-hydroxyquinolinolato-lithium), PBD(2-(4-biphenylyl)-5-(4-tert-butylphenyl)-1,3,4-oxadiazole), TAZ(3-(4-biphenyl)4-phenyl-5-tert-butylphenyl-1,2,4-triazole), spiro-PBD, and BAlq(bis(2-methyl-8-quinolinolate)-4-(phenylphenolato) aluminium), SAlq, TPBi(2,2',2"-(1,3,5-benzinetriyl)-tris(1-phenyl-1-H-benzimidazole), oxadiazole derives, triazole derives, phenanthroline derives, benzoxazole derives and benzthiazole derives.

The first electron transporting layer 113 may be comprised by mixing a plurality of first electron transporting materials with one another. The plurality of first electron transporting materials perform their respective functions different from one another and allows the first electron transporting layer 113 to perform complex functions. The plurality of first electron transporting materials may have properties the same as or similar to one another but their properties required to perform their respective functions may be different from one another.

The organic light emitting device 100 according to an example embodiment of the present disclosure may further include a first hole injecting layer between the anode AD and the first hole transporting layer 111. The organic light emitting device 100 according to an example embodiment of the present disclosure may further include a first electron blocking layer between the first hole transporting layer 111 and the first organic light emitting layer 112. The organic light emitting device 100 according to an example embodiment of the present disclosure may further include a first electron injecting layer between the cathode CA and the first electron transporting layer 113.

The charge generating layer 120 is arranged on the first light emitting unit 110. The charge generating layer 120 is arranged between the first light emitting unit 110 and a second light emitting unit 130, which will be described later, and supplies charges to the first light emitting unit 110 and the second light emitting unit 130. In other words, the charge generating layer 120 serves to control charge balance in the first light emitting unit 110 and the second light emitting unit 130. The charge generating layer 120 may be comprised of a plurality of layers, that is, an N type charge generating layer (N-GGL) and a P type charge generating layer (P-CGL). However, the charge generating layer 120 may be comprised of a single layer without limitation to the plurality of layers.

The N type charge generating layer injects electrons into the first light emitting unit 110. The N type charge generating layer may include an N type dopant material and an N type host material. The N type dopant material may be a metal of first and second groups on a periodic table, an organic material that may inject electrons, or their mixture. For example, the N type dopant material may be any one among alkali metal and alkali earth metal. That is, the N type charge generating layer may be formed of, but not limited to, an organic layer doped with alkali metal such as Li, Na, K or Cs, or alkali earth metal such as Mg, Sr, Ba or Ra. The N type host material may be formed of, but not limited to, a material that may transfer electrons, for example, any one or more of Alq$_3$(tris(8-hydroxyquinolino)aluminium), Liq(8-hydroxyquinolinolato-lithium), PBD(2-(4-biphenylyl)-5-(4-tert-butylphenyl)-1,3,4oxadiazole), TAZ(3-(4-biphenyl)4-phenyl-5-tert-butylphenyl-1,2,4-triazole), spiro-PBD, and BAlq(bis(2-methyl-8-quinolinolate)-4-(phenylphenolato) aluminium), SAlq, TPBi(2,2',2"-(1,3,5-benzinetriyl)-tris(1-phenyl-1-H-benzimidazole), oxadiazole, triazole, phenanthroline, benzoxazole and benzthiazole.

The P type charge generating layer injects holes into the second light emitting unit 130. The P type charge generating layer may include a P type dopant material and a P type host material. The P type charge generating layer is arranged on the N type charge generating layer and has a junction structure with the N type charge generating layer. The P type dopant material may be formed of, but not limited to, a metal oxide, an organic matter such as F$_4$-TCNQ(tetrafluorotetracyanoquinodimethane), HAT-CN(Hexaazatriphenylene-hexacarbonitrile), and hexaazatriphenylene derive, or a metal material such as V$_2$O$_5$, MoOx, and WO$_3$. For example, the P type dopant material may be formed of a material that may transfer holes, for example, may be formed of, but not limited to, a material that includes any one or more of NPD (N,N'-bis(naphthalene-1-yl)-N,N'-bis (phenyl)-2,2'-dimethylbenzidine), TPD(N,N'-bis-(3-methylphenyl)-N,N'-bis-(phenyl)-benzidine) and MTDATA(4,4', 4"-Tris(N-3-methylphenyl-N-phenyl-amino)-triphenylamine).

The second light emitting unit 130 is arranged on the charge generating layer 120. The second light emitting unit 130 is a light emitting unit that emits light of the same color as that of light emitted from the first light emitting unit 110. For example, the first light emitting unit 110 and the second light emitting unit 130 may together emit red light. In other words, the first organic light emitting layer 112 and the second organic light emitting layer 132 may together emit red light. Otherwise, the first light emitting unit 110 and the second light emitting unit 130 may together emit green light. In other words, the first organic light emitting layer 112 and the second organic light emitting layer 132 may together emit green light. Otherwise, the first light emitting unit 110 and the second light emitting unit 130 may together emit blue light. In other words, the first organic light emitting layer 112 and the second organic light emitting layer 132 may together emit blue light. Therefore, the description of the first light emitting unit 110 that includes the first hole transporting layer 111, the first organic light emitting layer 112 and the first electron transporting layer 113 is applied to that of the second light emitting unit 130. In more detail, the description of the first hole transporting layer 111 is applied to that of the second hole transporting layer 131. The description of the first organic light emitting layer 112 is applied to that of the second organic light emitting layer 132. The description of the first host material included in the first organic light emitting layer 112 is applied to that of the second host material included in the second organic light emitting layer 132. The description of the first dopant material included in the first organic light emitting layer 112 is applied to that of the second dopant material included in the second organic light emitting layer 132. The description of the first electron transporting layer 113 is applied to that of the second electron transporting layer 133.

The organic light emitting device 100 according to an example embodiment of the present disclosure has the first and second dopant materials different from each other but emits the same color from the first light emitting unit 110 and the second light emitting unit 130. The relation of the first and second dopant materials of the organic light emitting device 100 according to an example embodiment of the present disclosure will be described later with reference to FIG. 3.

The first organic light emitting layer 112 is formed by doping the first dopant material on the first host material, and the second organic light emitting layer 132 is formed by doping the second dopant material on the second host material. A PL peak of the first dopant material and a PL peak of the second dopant material are adjacent to each other such that the color emitted from the first organic light emitting layer 112 is the same as that emitted from the second organic light emitting layer 132. At this time, the PL peak of the first dopant material and the PL peak of the second dopant material are very close to each other but are not the same as each other. For example, a difference between a wavelength of the PL peak of the first dopant material and a wavelength of the PL peak of the second dopant material is in the range of 0 nm to 15 nm.

Figure 1B:
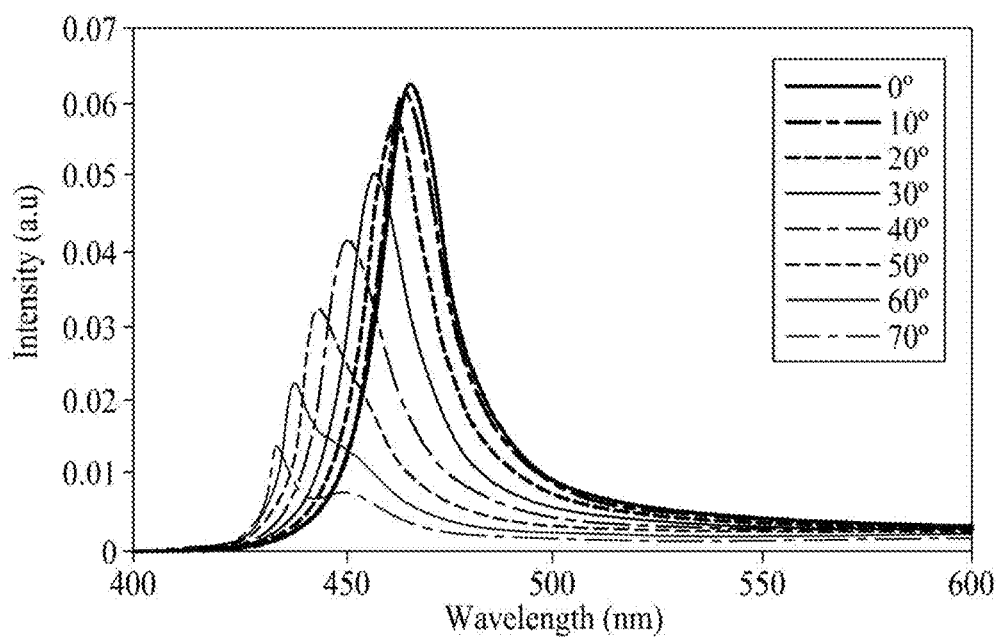
FIG. 1B is a view illustrating an out-coupling emittance spectrum according to an example embodiment of the present disclosure.
Figure 1C:
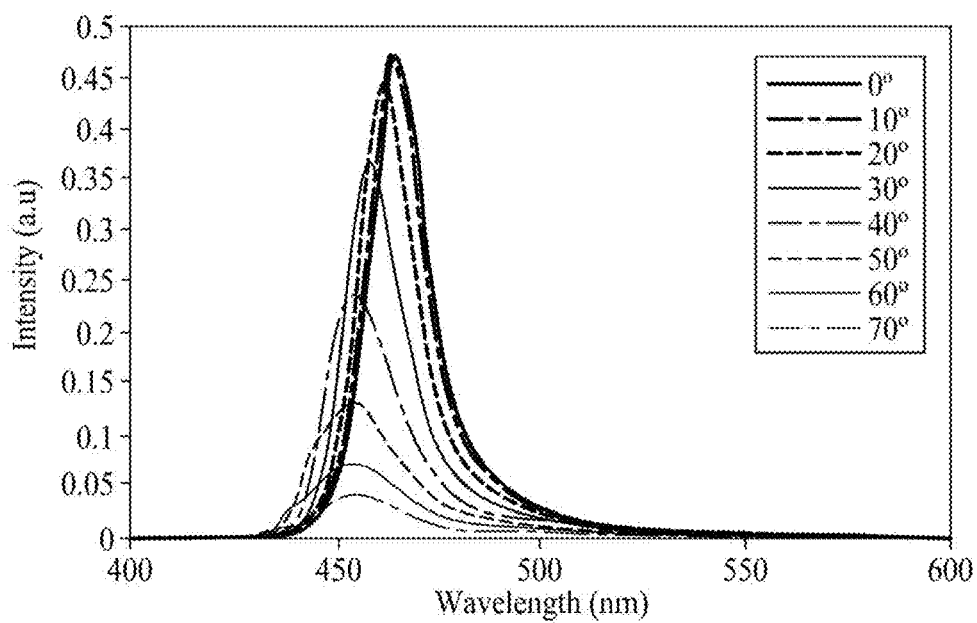
FIG. 1C is an EL (electroluminescence) spectrum of an organic light emitting diode according to an example embodiment of the present disclosure.

The structure of the organic light emitting device according to an example embodiment of the present disclosure is designed considering out-coupling such as cavity. The light emitted from the organic light emitting layer may be amplified by constructive interference when a unique resonance condition corresponding to a wavelength of the emitted light is satisfied. Considering the wavelength (hereinafter, referred to as main wavelength) of the light, the organic light emitting device 100 that may satisfy the resonance condition is designed and a dopant material which will be used for luminescence is selected. The dopant material may be referred to as a main dopant material in view of an aspect that the dopant material emits light corresponding to a reference wavelength. That is, the dopant material that may provide light of a wavelength which is a reference of the resonance condition of the organic light emitting device 100 is referred to as a main dopant material. A wavelength where a PL peak of the main dopant material is arranged becomes a main wavelength. The structure of the organic light emitting device 100 is designed considering the main wavelength, and an out-coupling emittance spectrum curve at a front side of the organic light emitting device 100. In more detail, the structure of the organic light emitting device 100 is designed such that the main wavelength is the same as a wavelength of the out-coupling emittance spectrum curve at the front side. In other words, the PL peak of the main dopant material is overlapped with the peak of the out-coupling emittance spectrum curve at the front side. However, as shown in FIG. 1B, the out-coupling emittance spectrum curve of the organic light emitting device 100 is varied depending on a viewing angle of a user. That is, if the viewing angle of the user with respect to the organic light emitting device 100 is varied from 0° (that is front side) to the direction of 90° (that is lateral side), the peak of the out-coupling emittance spectrum curve of the organic light emitting device 100 is gradually moved to a short wavelength zone (that is, left side). If the viewing angle is increased, a difference in a path from an emitting place of light emitted by being refracted as much as the corresponding viewing angle to a user's eyes is increased, whereby a wavelength where constructive interference occurs becomes short.

If the viewing angle of the user with respect to the organic light emitting device 100 is varied from 0° (that is, front side) to the direction of 90° (that is lateral side), the main wavelength is not matched with the peak wavelength of the out-coupling emittance spectrum curve at the corresponding viewing angle. Therefore, in order to compensate mismatching between (1) the main wavelength and (2) the peak wavelength of the out-coupling emittance spectrum curve, which is caused by variation of the viewing angle, the organic light emitting device 100 according to an example embodiment of the present disclosure includes an auxiliary dopant material, which is different from the main dopant material, in addition to the main dopant material. The auxiliary dopant material is included in a light emitting unit other than a light emitting unit, which includes the main dopant material, of the first organic light emitting layer 112 and the second organic light emitting layer 132. For example, if the main dopant material is the first dopant material, the auxiliary dopant material is the second dopant material. That is, if the main dopant material is included in the first light emitting unit 110, the auxiliary dopant material is included in the second light emitting unit 130. On the contrary, if the main dopant material is the second dopant material, the auxiliary dopant material is the first dopant material. That is, if the main dopant material is included in the second light emitting unit 130, the auxiliary dopant material is included in the first light emitting unit 110. The auxiliary dopant material is different from the main dopant material but emits the same color as that emitted from the main dopant material. The relation between the auxiliary dopant material and the main dopant material will be described with reference to FIG. 3.

Figure 3:
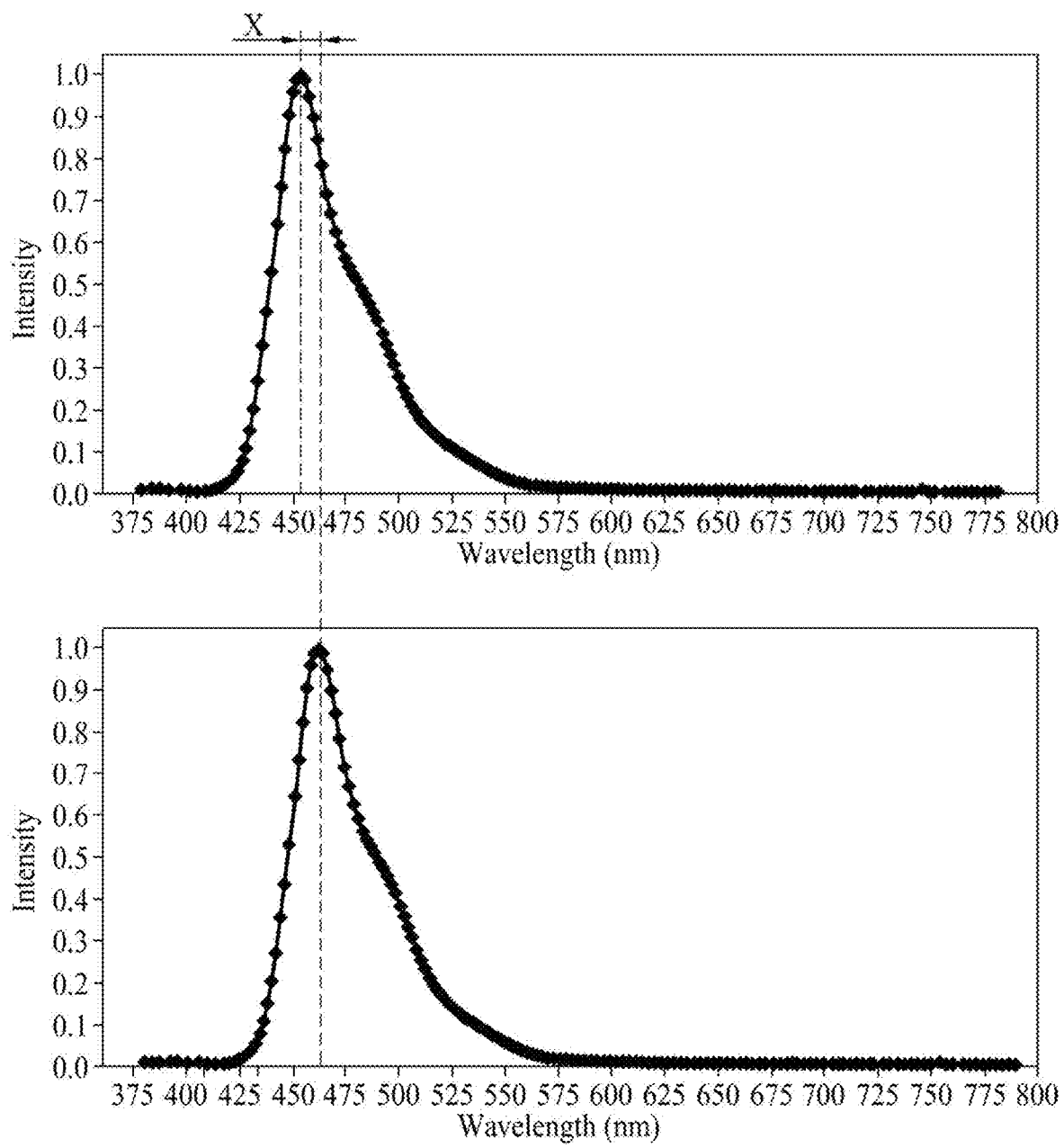
FIG. 3 is a view illustrating a PL spectrum (upper portion of FIG. 3) of an auxiliary dopant material and a PL spectrum (lower portion of FIG. 3) of a main dopant material according to an example embodiment of the present disclosure.

A PL spectrum of an upper portion in FIG. 3 is the PL spectrum of the auxiliary dopant material, and a PL spectrum of a lower portion in FIG. 3 is the PL spectrum of the main dopant material. As shown in FIG. 3, a PL peak of the auxiliary dopant material is spaced apart from a PL peak of the main dopant material at a certain interval. When a wavelength interval between the PL peak of the auxiliary dopant material and the PL peak of the main dopant material is X (at this time, X is an absolute value), X may be in the range of 0 nm<X≤15 nm. That is, the PL peak of the auxiliary dopant material may be arranged in a relatively short wavelength zone (that is, relatively left side) within the range of 0 nm to 15 nm of the PL peak of the main dopant material. In other words, the PL peak of the main dopant material may be arranged in a relatively long wavelength zone (that is, relatively right side) within the range of 0 nm to 15 nm of the PL peak of the auxiliary dopant material.

The auxiliary dopant material having the PL peak biased towards a short wavelength zone as compared with the PL peak of the main dopant material is selected considering matching with the peak of the out-coupling emittance spectrum curve when the user views the organic light emitting device 100 in a lateral direction. The out-coupling emittance spectrum curve when the user views the organic light emitting device 100 in a lateral direction is arranged to be biased towards a shorter wavelength zone than the out-coupling emittance spectrum curve when the user views the organic light emitting device 100 in a front direction. Therefore, the PL peak of the auxiliary dopant material is arranged to be biased towards a short wavelength zone as compared with the PL peak of the main dopant material, whereby the PL peak of the auxiliary dopant material is overlapped with the peak of the out-coupling emittance spectrum curve at the side.

In other words, the peak of the out-coupling emittance spectrum curve at a viewing angle 0° of the organic light emitting device 100 according to an example embodiment of the present disclosure is closer to the PL peak of the main dopant material than the PL peak of the auxiliary dopant material. The peak of the out-coupling emittance spectrum curve at a viewing angle 60° of the organic light emitting device 100 according to an example embodiment of the present disclosure is closer to the PL peak of the auxiliary dopant material than the PL peak of the main dopant material. For example, the main dopant material may be doped on the first organic light emitting layer 112 of the first light emitting unit 110 close to the anode, and the auxiliary dopant material may be doped on the second organic light emitting layer 132 of the second light emitting unit 130 close to the cathode. At this time, even though the main dopant material is different from the auxiliary dopant material, the wavelength of the PL peak of the main dopant material is a little different from the wavelength of the PL peak of the auxiliary dopant material, whereby the color emitted from the first light emitting unit 110 and the color emitted from the second light emitting unit 130 may be the same as each other. The first light emitting unit 110 and the second light emitting unit 130 emit the same colored light and at the same time reduce a color shift caused by variation of the viewing angle. In more detail, the out-coupling emittance spectrum curve of the organic light emitting device 100 is gradually moved to the short wavelength zone as the viewing angle is increased, whereby the out-coupling emittance spectrum curve is overlapped with the PL peak of the main dopant material and overlapped with the PL peak of the auxiliary dopant material. In other words, the PL peak overlapped with the peak of the out-coupling emittance spectrum curve of the organic light emitting device 100 may exist within the range of a full viewing angle including the side as well as the front. As the wavelength of the light is fully overlapped with the peak of the out-coupling emittance spectrum curve varied together with variation of the viewing angle in the range of the full viewing angle, (1) the color shift caused by variation of the viewing angle of the organic light emitting device 100 is reduced, and (2) luminescence efficiency of the organic light emitting device 100 is improved in accordance with the increase of an integrated value of an EL spectrum curve of the organic light emitting device 100.

Hereinafter, the organic light emitting diode according to an example embodiment of the present invention will be described with reference to FIGS. 4A to 4C.

Figure 4A:
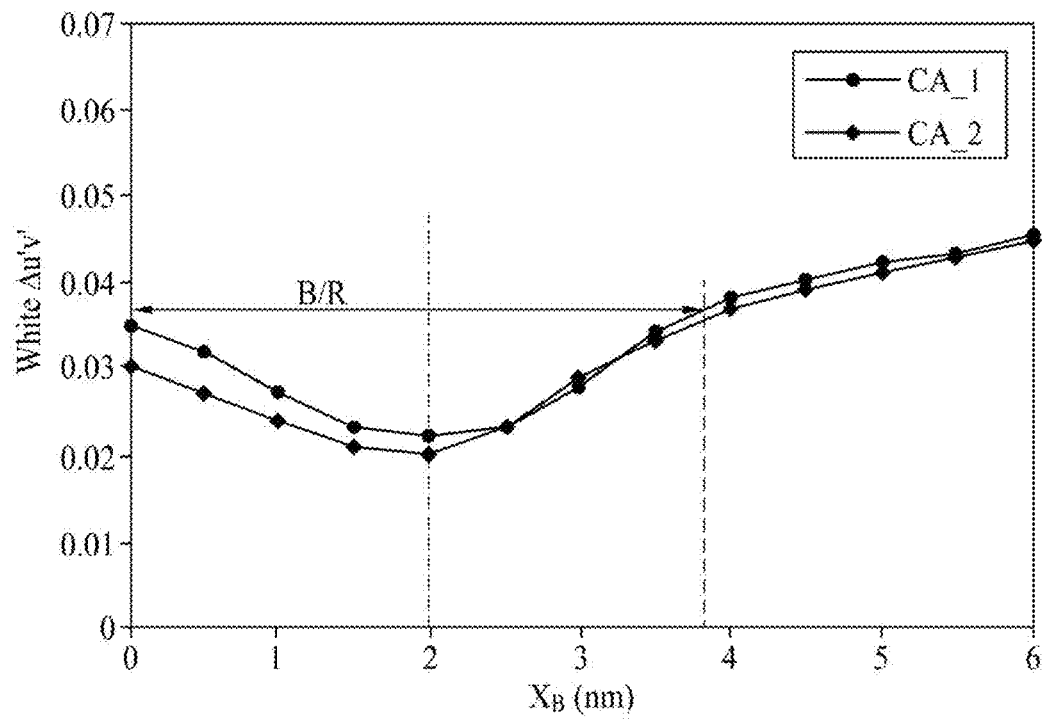
FIGS. 4A to 4C are graphs illustrating white color shift of an organic light emitting device according to an example embodiment of the present disclosure.
Figure 4B:
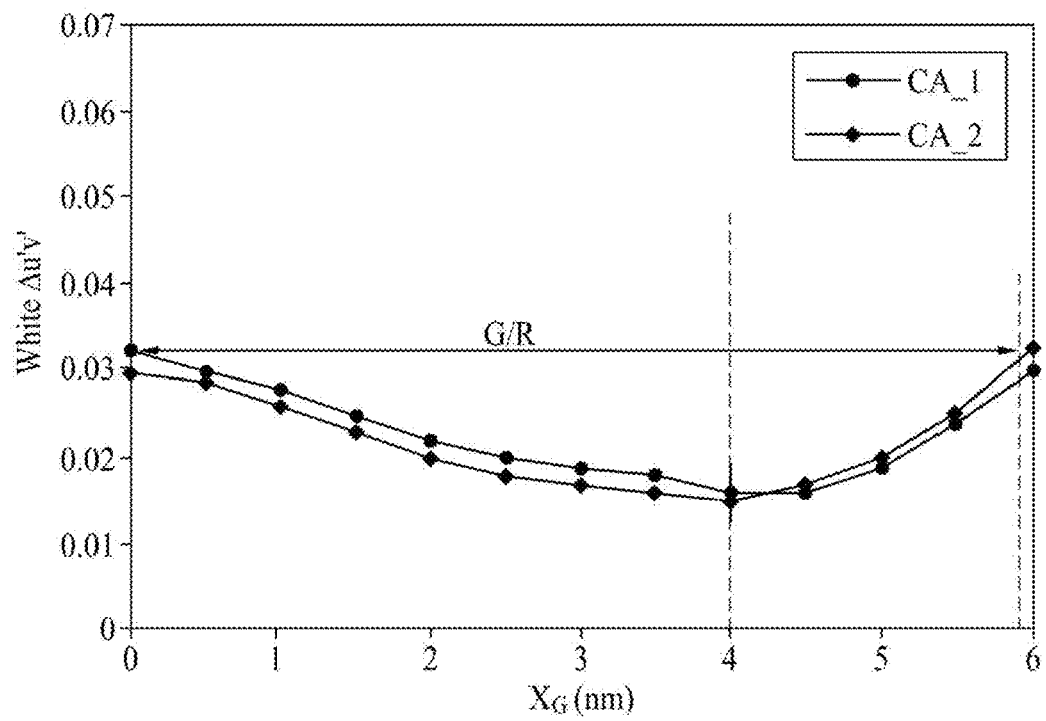
Figure 4C:
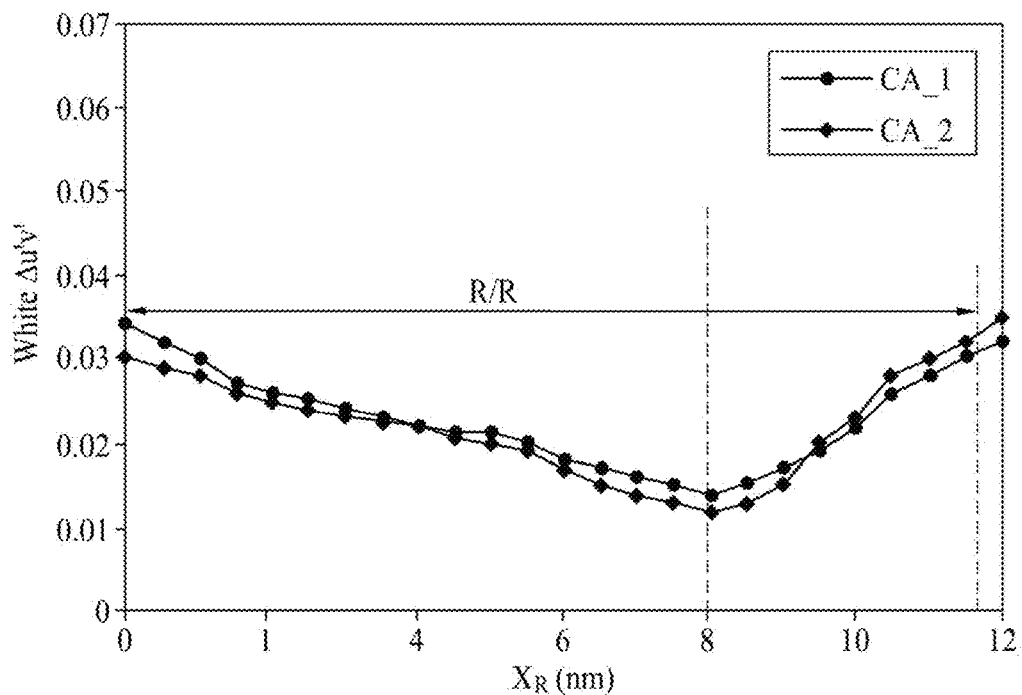

FIGS. 4A to 4C are graphs illustrating a white color shift of an organic light emitting device, which includes a sub organic light emitting device as one element and emits white light, wherein the sub organic light emitting device includes an auxiliary dopant material and a main dopant material. That is, the organic light emitting device according to the example embodiment of the present disclosure in FIGS. 4A to 4C includes the organic light emitting device 100 of FIG. 3 as a sub organic light emitting device.

In FIGS. 4A to 4C, an axis X represents a value X, and an axis Y represents Δu'v' (displacement difference of standard chromaticity diagram) of white light of the corresponding white organic light emitting device. When the value X of the organic light emitting device 100 has a random value, whether the organic light emitting device of FIGS. 4A to 4C, which includes the organic light emitting device 100 of FIG. 3, maintains white light regardless of the viewing angle will be described with reference to FIGS. 4A to 4C.

The organic light emitting device of FIGS. 4A to 4C may include (1) a red sub organic light emitting device, which includes a first red light emitting unit, a charge generating layer and a second red light emitting unit, (2) a green sub organic light emitting device, which includes a first green light emitting unit, a charge generating layer and a green second light emitting unit, and (3) a blue sub organic light emitting device, which includes a first blue light emitting unit, a charge generating layer and a second blue light emitting unit, thereby emitting white light. At this time, the first red light emitting unit includes a first red organic light emitting layer doped with a red main dopant material, and the second red light emitting unit includes a second red organic light emitting layer doped with a red auxiliary dopant material. The first green light emitting unit includes a first green organic light emitting layer doped with a green main dopant material, and the second green light emitting unit includes a second green organic light emitting layer doped with a green auxiliary dopant material. The first blue light emitting unit includes a first blue organic light emitting layer doped with a blue main dopant material, and the second blue light emitting unit includes a second blue organic light emitting layer doped with a blue auxiliary dopant material. An absolute value of a difference between a wavelength of a PL peak of the red main dopant material and a wavelength of a PL peak of the red auxiliary dopant material is referred to as $X_R$. Also, an absolute value of a difference between a wavelength of a PL peak of the green main dopant material and a wavelength of a PL peak of the green auxiliary dopant material is referred to as $X_G$. Also, an absolute value of a difference between a wavelength of a PL peak of the blue main dopant material and a wavelength of a PL peak of the blue auxiliary dopant material is referred to as $X_B$. At this time, at least one among $X_R$, $X_G$ and $X_B$ is greater than 0 (zero).

That is, in case of at least one of the blue sub organic light emitting device, the green sub organic light emitting device and the red sub organic light emitting device, which are included in the organic light emitting device according to an example embodiment of the present disclosure of FIGS. 4A to 4C, the wavelength of the PL peak of the first dopant material and the wavelength of the PL peak of the second dopant material are a little spaced apart from each other as the first dopant material doped on the first organic light emitting layer of the first light emitting unit and the second dopant material doped on the second organic light emitting layer of the second light emitting unit are different from each other.

To this end, in the red sub organic light emitting device, the first red light emitting unit, the charge generating layer and the second red light emitting unit are sequentially deposited between the anode and the cathode, and the wavelength of the PL peak of the red auxiliary dopant material may be at a wavelength zone shorter than that of the wavelength of the PL peak of the red main dopant material. At this time, the red auxiliary dopant material may correspond to the first red dopant material or the second red dopant material.

Otherwise, in the green sub organic light emitting device, the first green light emitting unit, the charge generating layer and the second green light emitting unit are sequentially deposited between the anode and the cathode, and the wavelength of the PL peak of the green auxiliary dopant material may be at a wavelength zone shorter than that of the wavelength of the PL peak of the green main dopant material. At this time, the green auxiliary dopant material may correspond to the first green dopant material or the second green dopant material.

Otherwise, in the blue sub organic light emitting device, the first blue light emitting unit, the charge generating layer and the second blue light emitting unit are sequentially deposited between the anode and the cathode, and the wavelength of the PL peak of the blue auxiliary dopant material may be at a wavelength zone shorter than that of the wavelength of the PL peak of the blue main dopant material. At this time, the blue auxiliary dopant material may correspond to the first blue dopant material or the second blue dopant material.

FIG. 4A is a graph illustrating a white color shift (at a viewing angle of 60°) in a case where only the blue sub organic light emitting device among the blue sub organic light emitting device, the green sub organic light emitting device and the red sub organic light emitting device, which constitute the white organic light emitting device, includes a main dopant material and an auxiliary dopant material. That is, only the blue sub organic light emitting device uses different dopant materials, that is, the main dopant material and the auxiliary dopant material for the first organic light emitting layer and the second organic light emitting layer, and the other green and red sub organic light emitting devices use the same dopant material for the first organic light emitting layer and the second organic light emitting layer without identifying the main dopant material from the auxiliary dopant material. At this time, the color shift means a displacement difference of the standard chromaticity diagram drafted by the standard colorimetric system determined by the Commission International de l'Eclairage (CIE). Δu'v' in FIG. 4A is a displacement difference between the white light standard chromaticity diagram at the viewing angle 0° and the white light standard chromaticity diagram at the viewing angle 60°. The graph marked with round dots corresponds to a case (CA_1) where Ag—Mg alloy of a weight ratio of 1:9 is used as the cathode CA, and the graph marked with square dots corresponds to a case (CA_2) where Ag—Mg alloy of a weight ratio of 5:1 is used as the cathode CA.

In CA_1, an $X_B$ ($X_B$ means a value X of blue light) value period B/R having Δu'v' lower than initial Δu'v' is approximately in the range of 0 nm<$X_B$ (CA_1)≤3 nm. The value $X_B$ having the smallest Δu'v' is 2 nm. That is, in CA_1, when a difference between the PL peak wavelength of the main dopant material and the PL peak wavelength of the auxiliary dopant material in the organic light emitting device 100 emitting blue light is 2 nm, the white color shift is the smallest.

In CA_2, an $X_B$ value period B/R having Δu'v' lower than initial Δu'v' is approximately in the range of 0 nm<$X_B$ (CA_2)≤4 nm. The value $X_B$ having the smallest Δu'v' is 2 nm. That is, in CA_2, when a difference between the PL peak wavelength of the main dopant material and the PL peak wavelength of the auxiliary dopant material in the organic light emitting device 100 emitting blue light is 2 nm, the white color shift is the smallest.

When the $X_B$ value period B/R having Δu'v' lower than initial Δu'v' in CA_1 and the $X_B$ value period B/R having Δu'v' lower than initial Δu'v' in CA_2 are compared with each other, there is only a little difference between them. Therefore, in the organic light emitting device 100 emitting blue light as one element of the white organic light emitting device, the white color shift is reduced when the difference between the PL peak wavelength of the main dopant material and the PL peak wavelength of the auxiliary dopant material satisfies 0 nm<$X_B$≤4 nm, approximately. In the organic light emitting device 100 emitting blue light, if the condition of 0 nm<$X_B$≤4 nm is satisfied regardless of property of the cathode CA, even though the viewing angle is increased, display quality can be improved as the color shift is reduced.

FIG. 4B is a graph illustrating a white color shift (at a viewing angle of 60°) in a case where only the green sub organic light emitting device of the green sub organic light emitting device, the blue sub organic light emitting device and the red sub organic light emitting device, which constitute the white organic light emitting device, includes a main dopant material and an auxiliary dopant material. That is, only the green sub organic light emitting device uses different dopant materials, that is, the main dopant material and the auxiliary dopant material for the first organic light emitting layer and the second organic light emitting layer, and the other blue and red sub organic light emitting devices use the same dopant material for the first organic light emitting layer and the second organic light emitting layer without identifying the main dopant material from the auxiliary dopant material. At this time, the color shift means a displacement difference of the standard chromaticity diagram drafted by the standard colorimetric system determined by the Commission International de l'Eclairage (CIE). Δu'v' in FIG. 4B is a displacement difference between the white light standard chromaticity diagram at the viewing angle 0° and the white light standard chromaticity diagram at the viewing angle 60°. The graph marked with round dots corresponds to a case (CA_1) where Ag—Mg alloy of a weight ratio of 1:9 is used as the cathode CA, and the graph marked with square dots corresponds to a case (CA_2) where Ag—Mg alloy of a weight ratio of 5:1 is used as the cathode CA.

In CA_1, an $X_G$ ($X_G$ means a value X of green light) value period G/R having Δu'v' lower than initial Δu'v' is approximately in the range of 0 nm<$X_G$ (CA_1)≤6 nm. The value $X_G$ having the smallest Δu'v' is 4 nm. That is, in CA_1, when a difference between the PL peak wavelength of the main dopant material and the PL peak wavelength of the auxiliary dopant material in the organic light emitting device 100 emitting green light is 4 nm, the white color shift is the smallest.

In CA_2, an $X_G$ value period G/R having Δu'v' lower than initial Δu'v' is approximately in the range of 0 nm<$X_G$ (CA_2)≤6 nm. The value $X_G$ having the smallest Δu'v' is 4 nm. That is, in CA_2, when a difference between the PL peak wavelength of the main dopant material and the PL peak wavelength of the auxiliary dopant material in the organic light emitting device 100 emitting green light is 4 nm, the white color shift is the smallest.

When the $X_G$ value period G/R having Δu'v' lower than initial Δu'v' in CA_1 and the $X_G$ value period G/R having Δu'v' lower than initial Δu'v' in CA_2 are compared with each other, there is only a little difference between them. Therefore, in the organic light emitting device 100 emitting green light as one element of the white organic light emitting device, the white color shift is reduced when the difference between the PL peak wavelength of the main dopant material and the PL peak wavelength of the auxiliary dopant material satisfies 0 nm<$X_G$≤6 nm, approximately. In the organic light emitting device 100 emitting green light, if the condition of 0 nm<$X_G$≤6 nm is satisfied regardless of property of the cathode CA, even though the viewing angle is increased, display quality can be improved as the color shift is reduced.

FIG. 4C is a graph illustrating a white color shift (@ viewing angle 60°) in a case where only the red sub organic light emitting device of the red sub organic light emitting device, the green sub organic light emitting device and the blue sub organic light emitting device, which constitute the white organic light emitting device, includes a main dopant material and an auxiliary dopant material. That is, only the red sub organic light emitting device uses different dopant materials, that is, the main dopant material and the auxiliary dopant material for the first organic light emitting layer and the second organic light emitting layer, and the other green and blue sub organic light emitting devices use the same dopant material for the first organic light emitting layer and the second organic light emitting layer without identifying the main dopant material from the auxiliary dopant material. At this time, the color shift means a displacement difference of the standard chromaticity diagram drafted by the standard colorimetric system determined by the Commission International de l'Eclairage (CIE). Δu'v' in FIG. 4C is a displacement difference between the white light standard chromaticity diagram at the viewing angle 0° and the white light standard chromaticity diagram at the viewing angle 60°. The graph marked with round dots corresponds to a case (CA_1) where Ag—Mg alloy of a weight ratio of 1:9 is used as the cathode CA, and the graph marked with square dots corresponds to a case (CA_2) where Ag—Mg alloy of a weight ratio of 5:1 is used as the cathode CA.

In CA_1, an $X_R$ ($X_R$ means a value X of red light) value period R/R having Δu'v' lower than initial Δu'v' is approximately in the range of 0 nm<$X_R$ (CA_1)≤12 nm. The value $X_R$ having the smallest Δu'v' is 8 nm. That is, in CA_1, when a difference between the PL peak wavelength of the main dopant material and the PL peak wavelength of the auxiliary dopant material in the organic light emitting device 100 emitting red light is 8 nm, the white color shift is the smallest.

In CA_2, an $X_R$ value period R/R having Δu'v' lower than initial Δu'v' is approximately in the range of 0 nm<$X_R$ (CA_2)≤12 nm. The value $X_R$ having the smallest Δu'v' is 8 nm. That is, in CA_2, when a difference between the PL peak wavelength of the main dopant material and the PL peak wavelength of the auxiliary dopant material in the organic light emitting device 100 emitting red light is 8 nm, the white color shift is the smallest.

When the $X_R$ value period R/R having Δu'v' lower than initial Δu'v' in CA_1 and the $X_R$ value period R/R having Δu'v' lower than initial Δu'v' in CA_2 are compared with each other, there is only a little difference between them. Therefore, in the organic light emitting device 100 emitting red light as one element of the white organic light emitting device, the white color shift is reduced when the difference between the PL peak wavelength of the main dopant material and the PL peak wavelength of the auxiliary dopant material satisfies 0 nm<$X_R$≤12 nm, approximately. In the organic light emitting device 100 emitting red light, if the condition of 0 nm<$X_R$≤12 nm is satisfied regardless of property of the cathode CA, even though the viewing angle is increased, display quality can be improved as the color shift is reduced.

Referring to FIGS. 4A to 4C, it is noted that maximum value of the $X_R$ value period (R/R)>maximum value of the $X_G$ value period (G/R)>maximum value of the $X_B$ value period (B/R). Therefore, in the white organic light emitting device according to an example embodiment of the present disclosure, for example, $X_R$, $X_G$ and $X_B$ satisfy the range of 0 nm to 15 nm and at the same time $X_R$>$X_G$>$X_B$ may be satisfied, whereby the white color shift can be reduced effectively.

The white color shift graphs of the organic light emitting device in FIGS. 4A to 4C are obtained by varying only one X value of the three sub organic light emitting devices constituting the white organic light emitting device. That is, FIG. 4A is the white color shift graph on the condition that only $X_B$ is gradually increased but $X_R$ and $X_G$ are fixed to 0 (zero), FIG. 4B is the white color shift graph on the condition that only $X_G$ is gradually increased but $X_R$ and $X_B$ are fixed to 0 (zero), and FIG. 4C is the white color shift graph on the condition that only $X_R$ is gradually increased but $X_G$ and $X_B$ are fixed to 0 (zero). Therefore, the optimized condition for minimizing the white color shift while varying $X_R$, $X_G$ and $X_B$ will be described with reference to FIGS. 5A to 5C.

Figure 5A:
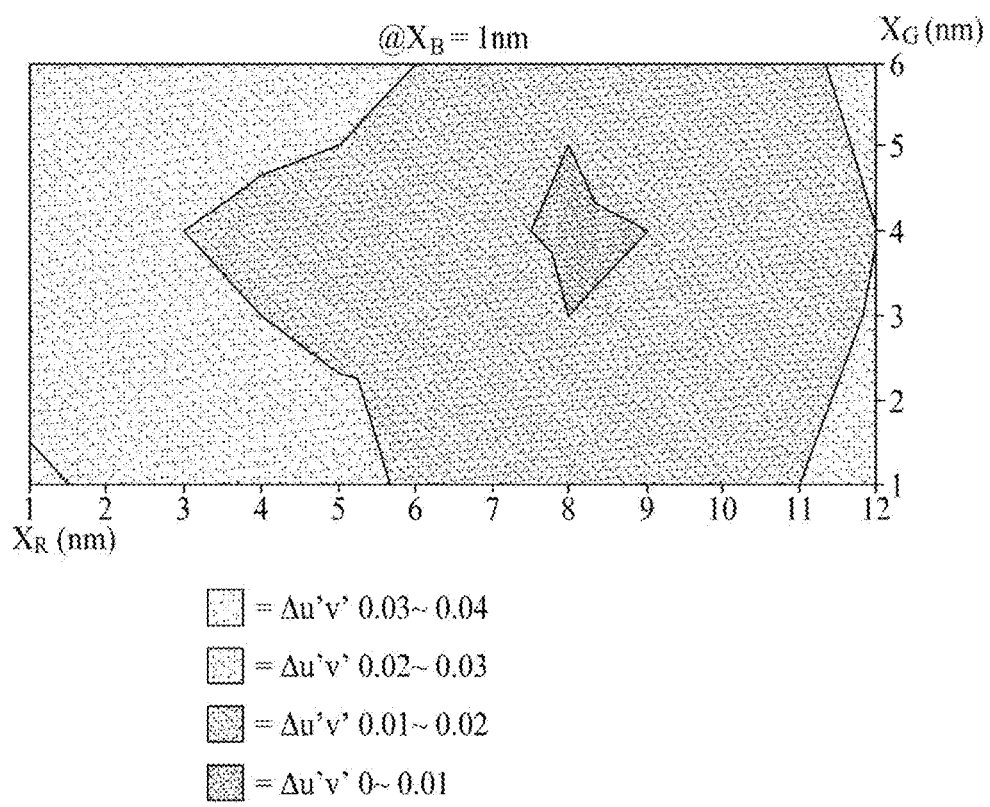
FIGS. 5A to 5C are contour graphs illustrating white color shift of an organic light emitting device according to an example embodiment of the present disclosure.
Figure 5B:
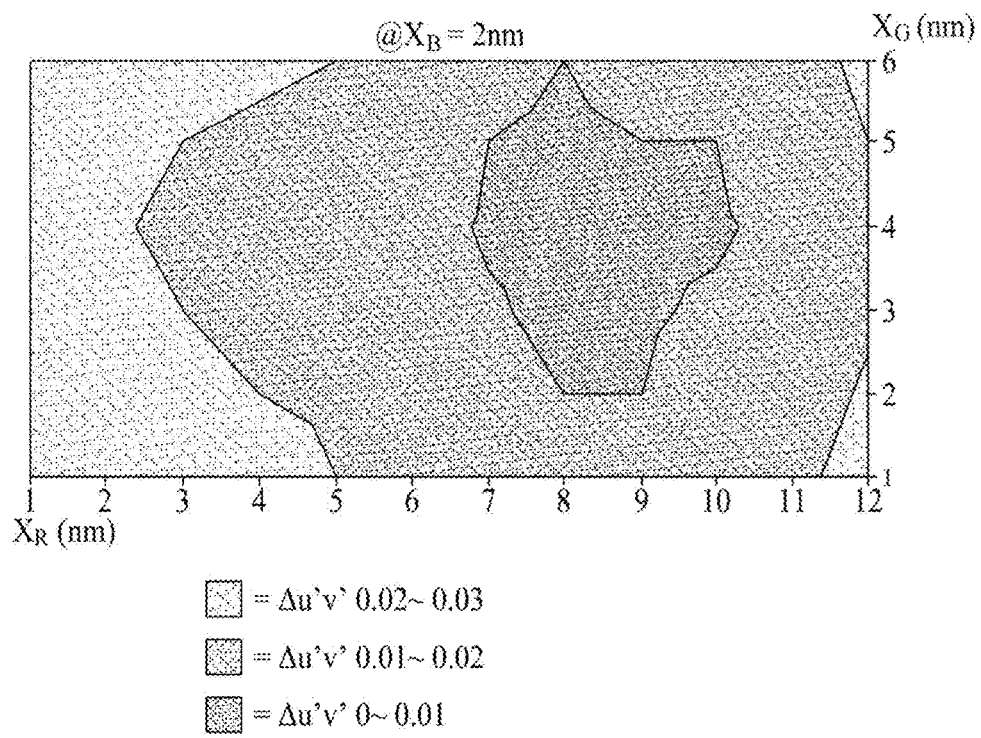
Figure 5C:
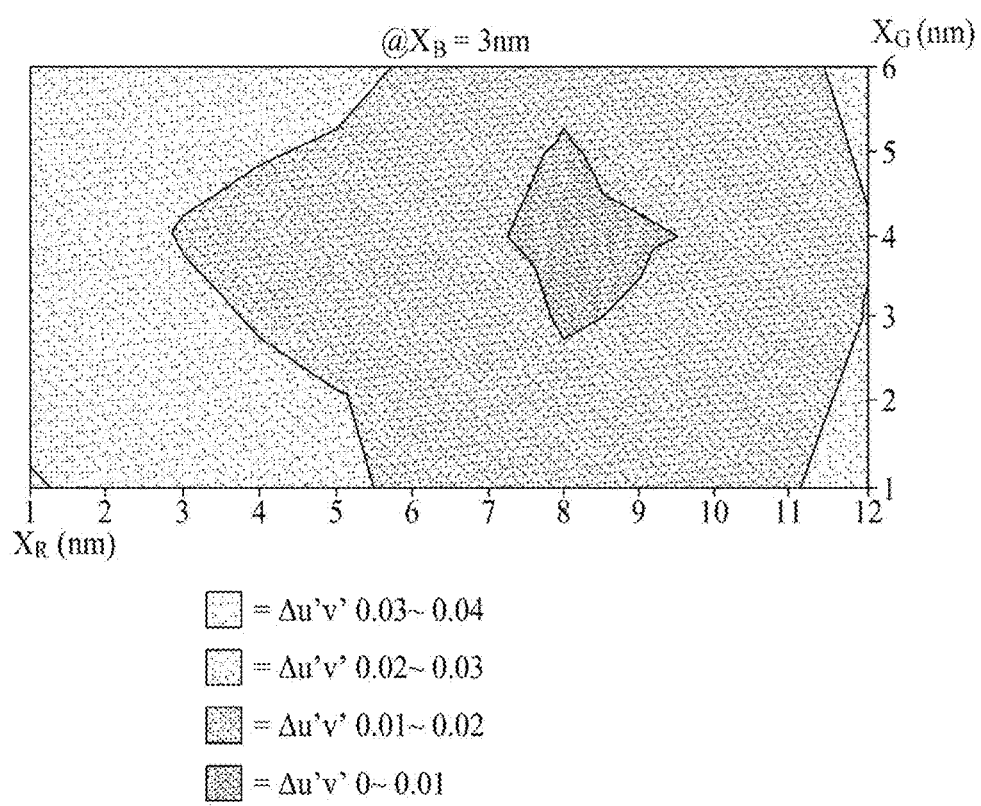

FIGS. 5A to 5C are contour graphs illustrating white color shift of an organic light emitting device according to an example embodiment of the present disclosure, which is comprised of blue, green and red sub organic light emitting devices, each of which includes an auxiliary dopant material and a main dopant material, and emits white light. That is, the organic light emitting device of FIGS. 5A to 5C includes the blue, green and red sub organic light emitting devices 100 corresponding to the organic light emitting device 100 in FIG. 3, and is the white organic light emitting device emitting white light, obtained by combination of the sub organic light emitting devices. Whether the organic light emitting device of FIGS. 5A to 5C maintains a color of the white light regardless of the viewing angle when the X value of each of the blue, green and red sub organic light emitting devices 100 has a random value will be described with reference to FIGS. 5A to 5C.

FIG. 5A is the contour graph illustrating that Δu'v' of the white light for each combination as the white organic light emitting device represents X value $X_R$ of the red sub organic light emitting device on an axis X and X value $X_G$ of the green sub organic light emitting device on an axis Y with respect to the blue organic light emitting device 100 of which X value is 1 nm ($X_B$=1 nm). It is noted that an area of a zone indicating the smallest Δu'v' is very narrow. In case of $X_B$=1 nm, it is noted that Δu'v' of the white light is minimized when a combination of $X_R$=8 nm and $X_G$=4 nm is obtained.

FIG. 5B is the contour graph illustrating that Δu'v' of the white light for each combination as the white organic light emitting device represents X value $X_R$ of the red sub organic light emitting device on an axis X and X value $X_G$ of the green sub organic light emitting device on an axis Y with respect to the blue organic light emitting device 100 of which X value is 2 nm ($X_B$=2 nm). It is noted that an area of a zone indicating the smallest Δu'v' is relatively wider than that of FIG. 5A. Therefore, it is noted that Δu'v' of the white light in the white organic light emitting device shown in FIG. 5B is more minimized than the white organic light emitting device shown in FIG. 5A. In case of $X_B$=2 nm, it is noted that Δu'v' of the white light is minimized when a combination of $X_R$=8 nm to 9 nm and $X_G$=4 nm is obtained.

FIG. 5C is the contour graph illustrating that Δu'v' of the white light for each combination as the white organic light emitting device represents X value $X_R$ of the red sub organic light emitting device on an axis X and X value $X_G$ of the green sub organic light emitting device on an axis Y with respect to the blue organic light emitting device 100 of which X value is 3 nm ($X_B$=3 nm). It is noted that an area of a zone indicating the smallest Δu'v' is smaller than that of FIG. 5B. Therefore, it is noted that Δu'v' of the white light in the white organic light emitting device shown in FIG. 5B is more minimized than the white organic light emitting device shown in FIG. 5C. In case of $X_B$=3 nm, it is noted that Δu'v' of the white light is minimized when a combination of $X_R$=8 nm and $X_G$=4 nm is obtained.

It is noted that Δu'v' of the white light in the organic light emitting device according to an example embodiment of the present disclosure of FIGS. 5A to 5C is minimized when the blue, green and red sub organic light emitting devices 100 respectively satisfy the conditions of $X_B$=2 nm, $X_G$=4 nm, and $X_R$=(8 nm to 9 nm). Therefore, it is noted that the white color shift is reduced effectively when $X_R$, $X_G$ and $X_B$ satisfy the range of 0 nm to 15 nm and at the same time satisfy $X_R > X_G > X_B$.

Hereinafter, levels of a white color shift caused by variation of a viewing angle between a comparison example and one embodiment will be described with reference to FIGS. 6 to 8.

The comparison example is a white organic light emitting device that includes a blue sub organic light emitting device, a green sub organic light emitting device and a red sub organic light emitting device. First and second blue organic light emitting layers of the blue sub organic light emitting device are doped with the same dopant material. First and second red organic light emitting layers of the red sub organic light emitting device are doped with the same dopant material. First and second green organic light emitting layers of the green sub organic light emitting device are doped with the same dopant material. That is, the comparison example is a white organic light emitting device of which $X_R$, $X_G$ and $X_B$ are all 0 nm.

The example embodiment may be a white organic light emitting device that includes a blue sub organic light emitting device, a green sub organic light emitting device and a red sub organic light emitting device. First and second blue organic light emitting layers of the blue sub organic light emitting device are doped with their respective dopant materials different from each other. In more detail, $X_B$ is 2 nm. First and second green organic light emitting layers of the green sub organic light emitting device are doped with their respective dopant materials different from each other. In more detail, $X_G$ is 4 nm. First and second red organic light emitting layers of the red sub organic light emitting device are doped with their respective dopant materials different from each other. In more detail, $X_R$ is 8 nm. That is, the example embodiment may be a white organic light emitting device of which $X_R$, $X_G$ and $X_B$ are respectively $X_R$=8 nm, $X_G$=4 nm, and $X_B$=2 nm.

In case of the white organic light emitting device, chromaticity of light generated in each of the blue sub organic light emitting device, the green sub organic light emitting device and the red sub organic light emitting device and a luminance combination ratio of each light are designed appropriately to realize white light (that is, white light having a specific white u'v' coordinate, for example, u'=0.198,v'=0.468) of desired chromaticity.

Figure 6:
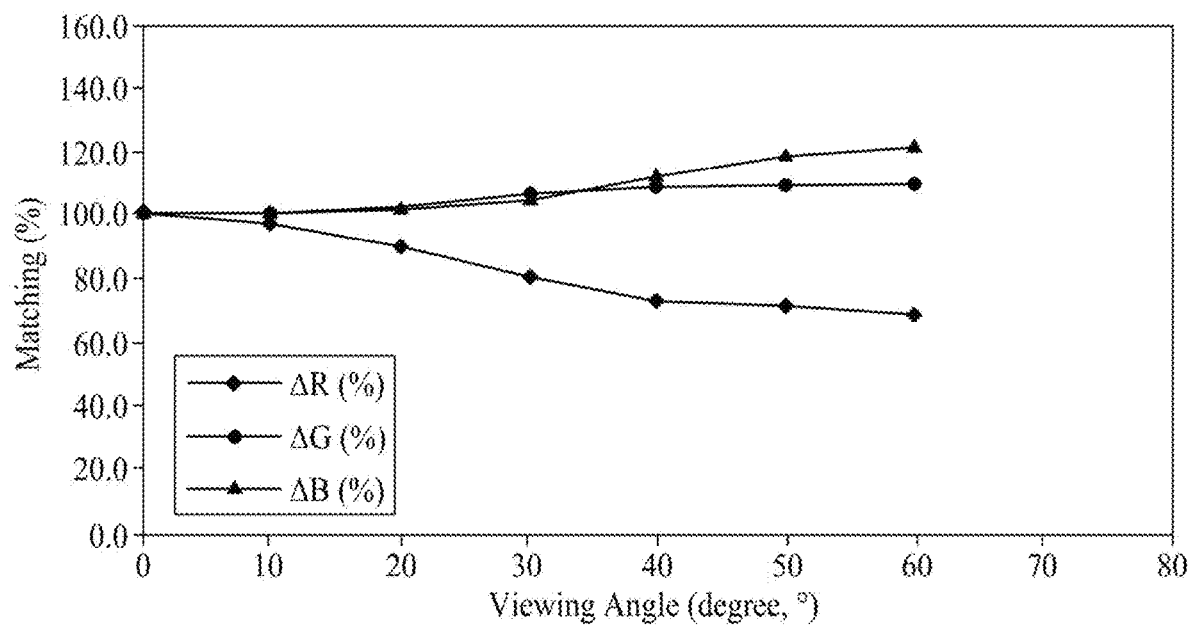
FIGS. 6 and 7 are graphs illustrating a luminance ratio variation of each of blue light, green light and red light, which is caused by variation of a viewing angle, according to an example embodiment of the present disclosure.
Figure 7:
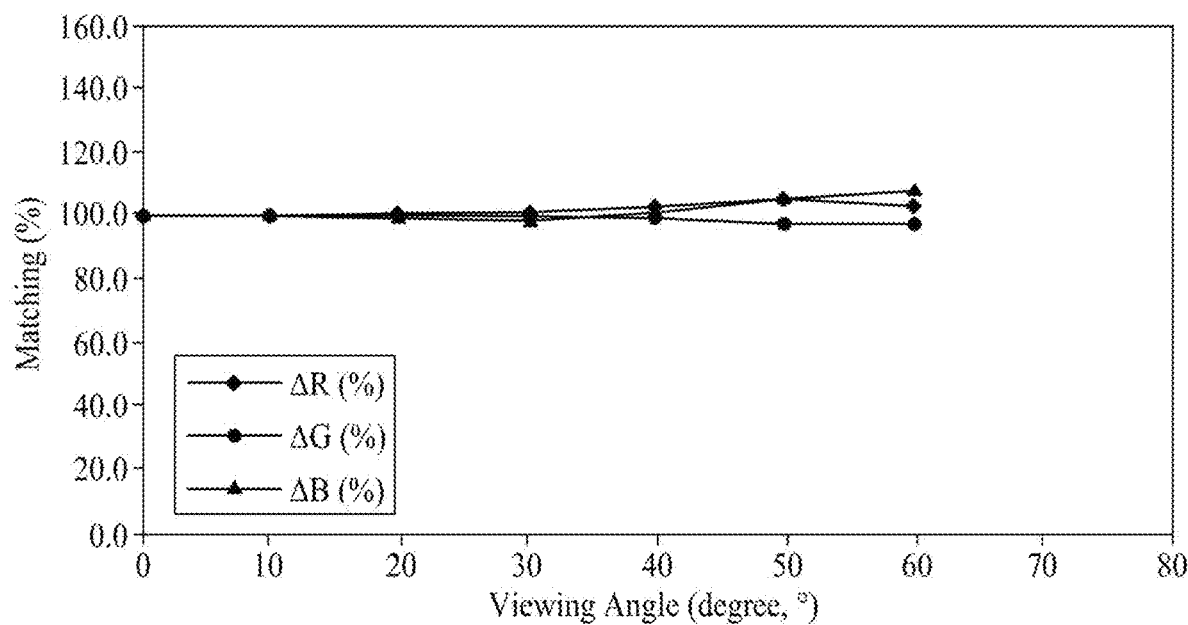

The graphs of FIGS. 6 and 7 illustrate how a luminance ratio of each of blue light, green light and red light is shifted as a viewing angle is gradually increased when a combination of blue light, green light and red light at a viewing angle of 0° is 100% in order that the white organic light emitting device realizes white light. FIG. 6 is the graph of the comparison example, and FIG. 7 is the graph of an example embodiment. If the graphs of FIGS. 6 and 7 are compared with each other, it is noted from the graph of the comparison example of FIG. 6 that a luminance ratio of all of blue light, green light and red light is varied if a viewing angle is increased as compared with the viewing angle of 0°. Therefore, it is expected that a color of white light in the white organic light emitting device of the comparison example will be shifted as the viewing angle is varied. On the other hand, it is noted from the graph of the example embodiment of FIG. 7 that a luminance ratio of all of blue light, green light and red light is almost uniformly maintained if a viewing angle is increased as compared with the viewing angle of 0°. Therefore, it is expected that a color of white light in the white organic light emitting device will not be shifted even though the viewing angle is varied, or will be a little shifted.

Hereinafter, the level of the white color shift caused by variation of the viewing angle in the comparison example and an example embodiment will be described with reference to FIG. 8.

Figure 8:
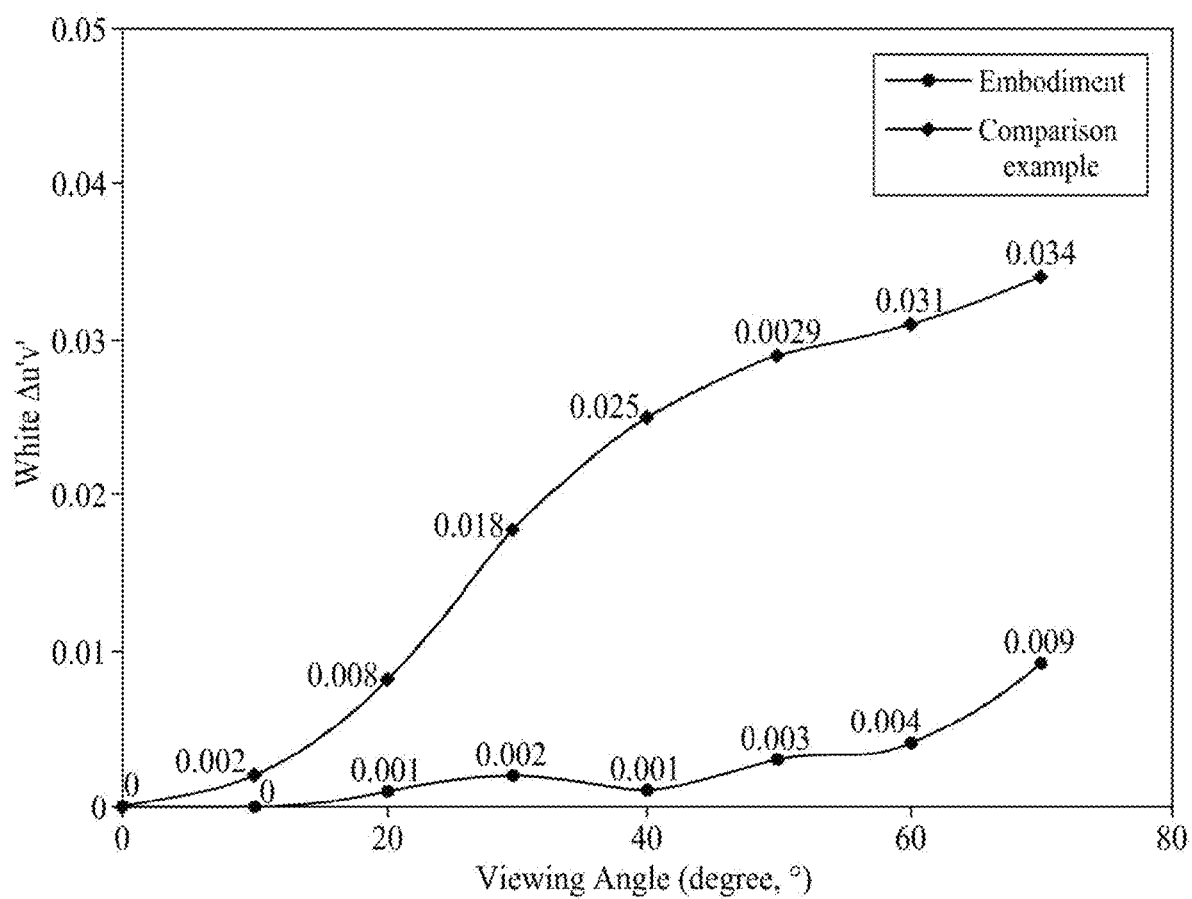
FIG. 8 is a graph illustrating white color shift caused by variation of a viewing angle according to an example embodiment of the present disclosure and a comparison example.

The graph of FIG. 8 illustrates how a color of white light is shifted as a viewing angle for the white organic light emitting device is gradually increased. The graph of the example embodiment in FIG. 8 is marked with round dots, and the graph of the comparison example is marked with square dots. The graph of the comparison example illustrates a displacement difference of 0.031 at a viewing angle of 60° as the standard chromaticity diagram of white light is rapidly varied if the viewing angle is increased as compared with the viewing angle of 0°. Therefore, it is noted that the color shift of white light in the white organic light emitting device of the comparison example is seriously generated as the viewing angle is varied. On the other hand, the graph of the example embodiment illustrates a displacement difference of 0.004 at a viewing angle of 60° as the standard chromaticity diagram of white light is a little varied if the viewing angle is increased as compared with the viewing angle of 0°. Therefore, it is noted that the color shift of white light in the white organic light emitting device of the example embodiment is little generated as the viewing angle is varied.

Moreover, luminance variation according to the viewing angle of the comparison example and an example embodiment will be described with reference to FIG. 9.

Figure 9:
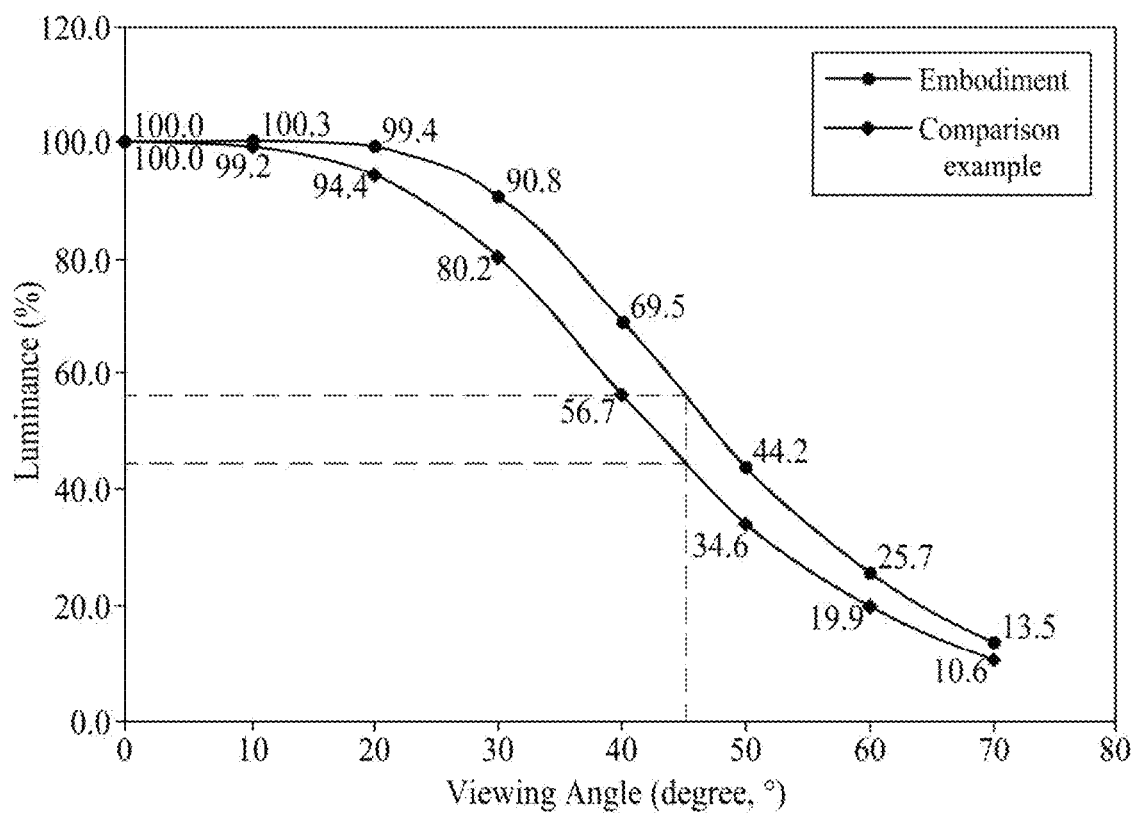
FIG. 9 is a graph illustrating luminance variation of white light, which is caused by variation of a viewing angle, according to an example embodiment of the present disclosure and a comparison example.

The graph of FIG. 9 illustrates how luminance of white light is reduced as the viewing angle for the white organic light emitting device is gradually increased. In more detail, the graph of FIG. 9 illustrates how luminance of white light is lowered as the viewing angle is gradually increased when luminance of white light at the viewing angle of 0° is 100% in the case that the white organic light emitting device realizes white light. In FIG. 9, the graph of the example embodiment is marked with round dots, and the graph of the comparison example is marked with square dots. In the full viewing angle range, the graph of the example embodiment is shown above the graph of the comparison example. It is noted from FIG. 9 that a reduced ratio of luminance in the example embodiment is lower than that of the comparison example even though the viewing angle is varied based on luminance at the viewing angle of 0°. Particularly, based on a viewing angle of 45°, it is noted that the comparison example generates luminance of 43% of luminance at the viewing angle of 0°, whereas the example embodiment generates luminance of 58% of luminance at the viewing angle of 0°. That is, the white organic light emitting device of the example embodiment as compared with the comparison example provides more excellent luminance when viewed from the side.

The organic light emitting device according to the example embodiment of the present disclosure may be described as follows.

The organic light emitting device may include an anode and a cathode, which are spaced apart from each other to face each other, and a first light emitting unit including a first organic light emitting layer, a charge generating layer, and a second light unit including a second organic light emitting layer, which are between the anode and the cathode, wherein a main dopant material is doped on any one of the first organic light emitting layer and the second organic light emitting layer, an auxiliary dopant material emitting the same colored light as that of the main dopant material is doped on the other one among the first organic light emitting layer or the second organic light emitting layer having the main dopant material doped thereon, and a photoluminescence (PL) peak of the main dopant material is in the range of 0 nm to 15 nm from a PL peak of the auxiliary dopant material.

In an example embodiment, the PL peak of the main dopant material is located in a relatively long wavelength zone within the range of 0 nm to 15 nm as compared with the PL peak of the auxiliary dopant material.

In an example embodiment, the peak of the out-coupling emittance spectrum curve at the viewing angle of 0° of the organic light emitting device is closer to the PL peak of the main dopant material than the PL peak of the auxiliary dopant material.

In an example embodiment, the peak of the out-coupling emittance spectrum curve at the viewing angle of 60° of the organic light emitting device is closer to the PL peak of the auxiliary dopant material than the PL peak of the main dopant material.

In the example embodiment, the first light emitting unit is located closer to the anode than the second light emitting unit, and the main dopant material may be doped on the first host material of the first organic light emitting layer while the auxiliary dopant material is doped on the second host material of the second organic light emitting layer.

In an example embodiment, a color of light emitted from the first light emitting unit is the same as that of light emitted from the second light emitting unit.

In an example embodiment, the main dopant material is different from that of the auxiliary dopant material.

In an example embodiment, a color of light emitted from the first light emitting unit and the second light emitting unit is blue, and a wavelength difference between the PL peak of the main dopant material and the PL peak of the auxiliary dopant material is between 0 nm and 4 nm.

In an example embodiment, the main dopant material is included in the first organic light emitting layer, and the second light emitting unit is located closer to the cathode than the first light emitting unit.

In an example embodiment, a color of light emitted from the first light emitting unit and the second light emitting unit is green, and a wavelength difference between the PL peak of the main dopant material and the PL peak of the auxiliary dopant material is between 0 nm and 6 nm.

In an example embodiment, the main dopant material is included in the first organic light emitting layer, and the second light emitting unit is located closer to the cathode than the first light emitting unit.

In an example embodiment, a color of light emitted from the first light emitting unit and the second light emitting unit is red, and a wavelength difference between the PL peak of the main dopant material and the PL peak of the auxiliary dopant material is between 0 nm and 12 nm.

In an example embodiment, the main dopant material is included in the first organic light emitting layer, and the second light emitting unit is located closer to the cathode than the first light emitting unit.

In an example embodiment, the organic light emitting device is a top emission organic light emitting device.

In another aspect, the organic light emitting device may include a red sub organic light emitting device, which includes a first red light emitting unit, a charge generating layer and a second red light emitting unit, a green sub organic light emitting device, which includes a first green light emitting unit, a charge generating layer and a second green light emitting unit, and a blue sub organic light emitting device, which includes a first blue light emitting unit, a charge generating layer and a second blue light emitting unit, wherein the first red light emitting unit includes a first red organic light emitting layer doped with a red main dopant material, the second red light emitting unit includes a second red organic light emitting layer doped with a red auxiliary dopant material, the first green light emitting unit includes a first green organic light emitting layer doped with a green main dopant material, the second green light emitting unit includes a second green organic light emitting layer doped with a green auxiliary dopant material, the first blue light emitting unit includes a first blue organic light emitting layer doped with a blue main dopant material, the second blue light emitting unit includes a second blue organic light emitting layer doped with a blue auxiliary dopant material, and at least one among $X_R$, $X_G$, and $X_B$ is greater than 0 (zero) when an absolute value of a difference between a photoluminescence (PL) peak wavelength of the red main dopant material and a PL peak wavelength of the red auxiliary dopant material is $X_R$, an absolute value of a difference between a PL peak wavelength of the green main dopant material and a PL peak wavelength of the green auxiliary dopant material is $X_G$, and an absolute value of a difference between a PL peak wavelength of the blue main dopant material and a PL peak wavelength of the blue auxiliary dopant material is $X_B$.

In an example embodiment, $X_R$, $X_G$, and $X_B$ satisfy $X_R > X_G, > X_B$.

In an example embodiment, $X_B$ satisfy $X_B > 0$ (zero).

In an example embodiment, the red sub organic light emitting device further includes an anode and a cathode, wherein the first red light emitting unit, the charge generating layer and the second red light emitting unit of the red sub organic light emitting device are sequentially between the anode and the cathode, and the PL peak wavelength of the red auxiliary dopant material is located in a shorter wavelength zone than that of the PL peak wavelength of the red main dopant material.

In an example embodiment, the green sub organic light emitting device further includes an anode and a cathode, wherein the first green light emitting unit, the charge generating layer and the second green light emitting unit of the green sub organic light emitting device are sequentially between the anode and the cathode, and the PL peak wavelength of the green auxiliary dopant material is located in a shorter wavelength zone than that of the PL peak wavelength of the green main dopant material.

In an example embodiment, the blue sub organic light emitting device further includes an anode and a cathode, wherein the first blue light emitting unit, the charge generating layer and the second blue light emitting unit of the blue sub organic light emitting device are sequentially between the anode and the cathode, and the PL peak wavelength of the blue auxiliary dopant material is located in a shorter wavelength zone than that of the PL peak wavelength of the blue main dopant material.

According to the various embodiments of the present disclosure, the organic light emitting device of which lifespan in a high temperature condition is more excellent than that in a room temperature condition may be provided. According to the various embodiments of the present disclosure, the organic light emitting device of which color shift caused by variation of a viewing angle is reduced may be provided.

According to the various embodiments of the present disclosure, the organic light emitting device of which luminance variation caused by variation of a viewing angle is reduced may be provided.

According to the various embodiments of the present disclosure, the organic light emitting device of which color shift of white light obtained by mixture of red light, green light and blue light is reduced as color shift and luminance variation of each of the red light, the green light and the blue light, which are caused by variation of a viewing angle, are reduced may be provided.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting device, comprising:
    a red sub organic light emitting device, which includes a first red light emitting unit, a charge generating layer, and a second red light emitting unit;
    a green sub organic light emitting device, which includes a first green light emitting unit, a charge generating layer, and a second green light emitting unit; and
    a blue sub organic light emitting device, which includes a first blue light emitting unit, a charge generating layer, and a second blue light emitting unit,
    wherein the first red light emitting unit includes a first red organic light emitting layer doped with a red main dopant material, the second red light emitting unit includes a second red organic light emitting layer doped with a red auxiliary dopant material,
    the first green light emitting unit includes a first green organic light emitting layer doped with a green main dopant material, the second green light emitting unit includes a second green organic light emitting layer doped with a green auxiliary dopant material,
    the first blue light emitting unit includes a first blue organic light emitting layer doped with a blue main dopant material, the second blue light emitting unit includes a second blue organic light emitting layer doped with a blue auxiliary dopant material,
    at least one of $X_R$, $X_G$, and $X_B$ is greater than 0 (zero) when an absolute value of a difference between a photoluminescence (PL) peak wavelength of the red main dopant material and a PL peak wavelength of the red auxiliary dopant material is $X_R$, an absolute value of a difference between a PL peak wavelength of the green main dopant material and a PL peak wavelength of the green auxiliary dopant material is $X_G$, and an absolute value of a difference between a PL peak wavelength of the blue main dopant material and a PL peak wavelength of the blue auxiliary dopant material is $X_B$,
    $X_R$, $X_G$ and $X_B$ satisfy a range of 0 nm to 15 nm, and $X_R$, $X_G$, and $X_B$ satisfy $X_R > X_G > X_B$.

2. The organic light emitting device of claim 1, wherein $X_B$ satisfies $X_B > 0$ (zero).

3. The organic light emitting device of claim 1, wherein the red sub organic light emitting device further includes an anode and a cathode, the first red light emitting unit, the charge generating layer and the second red light emitting unit of the red sub organic light emitting device are sequentially between the anode and the cathode, and the PL peak wavelength of the red auxiliary dopant material is located in a shorter wavelength zone than that of the PL peak wavelength of the red main dopant material.

4. The organic light emitting device of claim 1, wherein the green sub organic light emitting device further includes an anode and a cathode, wherein the first green light emitting unit, the charge generating layer and the second green light emitting unit of the green sub organic light emitting device are sequentially between the anode and the cathode, and the PL peak wavelength of the green auxiliary dopant material is located in a shorter wavelength zone than that of the PL peak wavelength of the green main dopant material.

5. The organic light emitting device of claim 1, wherein the blue sub organic light emitting device further includes an anode and a cathode, wherein the first blue light emitting unit, the charge generating layer, and the second blue light emitting unit of the blue sub organic light emitting device are sequentially between the anode and the cathode, and the PL peak wavelength of the blue auxiliary dopant material is located in a shorter wavelength zone than that of the PL peak wavelength of the blue main dopant material.

6. The organic light emitting device of claim 1, wherein $X_G$ satisfies 0 nm $< X_G \leq$ 6 nm.

7. The organic light emitting device of claim 1, wherein $X_B$ satisfies 0 nm $< X_B \leq$ 4 nm.

8. The organic light emitting device of claim 1,
    wherein:
    the red auxiliary dopant material is different from the red main dopant material;
    the green auxiliary dopant material is different from the green main dopant material; or
    the blue auxiliary dopant material is different from the blue main dopant material,
    wherein:
    each of the red sub organic light emitting device, the green sub organic light emitting device, and the blue sub organic light emitting device comprises a respective anode and a respective cathode, wherein:

rather than the first red light emitting unit, the second red light emitting unit is disposed closer to the respective cathode;

rather than the first green light emitting unit, the second green light emitting unit is disposed closer to the respective cathode; or rather than the first blue light emitting unit, the second blue light emitting unit is disposed closer to the respective cathode, and wherein:

the PL peak wavelength of the red auxiliary dopant material, in the second red light emitting unit disposed closer to the respective cathode, is located in a shorter wavelength zone than that of the PL peak wavelength of the red main dopant material;

the PL peak wavelength of the green auxiliary dopant material, in the second green light emitting unit disposed closer to the respective cathode, is located in a shorter wavelength zone than that of the PL peak wavelength of the green main dopant material; or the PL peak wavelength of the blue auxiliary dopant material, in the second blue light emitting unit disposed closer to the respective cathode, is located in a shorter wavelength zone than that of the PL peak wavelength of the blue main dopant material.

9. The organic light emitting device of claim 1, wherein:

the red auxiliary dopant material is different from the red main dopant material;

the green auxiliary dopant material is different from the green main dopant material; and the blue auxiliary dopant material is different from the blue main dopant material, wherein:

each of the red sub organic light emitting device, the green sub organic light emitting device, and the blue sub organic light emitting device comprises a respective anode and a respective cathode, wherein:

rather than the first red light emitting unit, the second red light emitting unit is disposed closer to the respective cathode;

rather than the first green light emitting unit, the second green light emitting unit is disposed closer to the respective cathode; and rather than the first blue light emitting unit, the second blue light emitting unit is disposed closer to the respective cathode, and wherein:

the PL peak wavelength of the red auxiliary dopant material, in the second red light emitting unit disposed closer to the respective cathode, is located in a shorter wavelength zone than that of the PL peak wavelength of the red main dopant material;

the PL peak wavelength of the green auxiliary dopant material, in the second green light emitting unit disposed closer to the respective cathode, is located in a shorter wavelength zone than that of the PL peak wavelength of the green main dopant material; and the PL peak wavelength of the blue auxiliary dopant material, in the second blue light emitting unit disposed closer to the respective cathode, is located in a shorter wavelength zone than that of the PL peak wavelength of the blue main dopant material.

* * * * *